(12) United States Patent
Dunworth et al.

(10) Patent No.: US 8,531,219 B1
(45) Date of Patent: Sep. 10, 2013

(54) PHASE LOCKED LOOP WITH DIGITAL COMPENSATION FOR ANALOG INTEGRATION

(71) Applicant: QUALCOMM Incorporated, San Diego, CA (US)

(72) Inventors: Jeremy D. Dunworth, San Diego, CA (US); Gary J. Ballantyne, San Diego, CA (US); Bhushan S. Asuri, San Diego, CA (US); Jifeng Geng, San Diego, CA (US); Gurkanwal S. Sahota, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/866,871

(22) Filed: Apr. 19, 2013

Related U.S. Application Data

(63) Continuation of application No. 12/632,053, filed on Dec. 7, 2009, now Pat. No. 8,446,191.

(51) Int. Cl.
*H03L 7/06* (2006.01)

(52) U.S. Cl.
USPC .......................................... 327/156; 327/147

(58) Field of Classification Search
USPC ................................................. 327/147, 156
See application file for complete search history.

(56) References Cited

U.S. PATENT DOCUMENTS

| | | | |
|---|---|---|---|
| 5,648,964 A | 7/1997 | Inagaki et al. | |
| 5,757,238 A | 5/1998 | Ferraiolo et al. | |
| 5,978,425 A | 11/1999 | Takla | |
| 5,999,060 A | 12/1999 | Zuta | |
| 6,094,101 A | 7/2000 | Sander et al. | |
| 6,114,920 A | 9/2000 | Moon et al. | |
| 6,188,288 B1 | 2/2001 | Ragan et al. | |
| 6,700,447 B1 | 3/2004 | Nilsson | |
| 6,809,598 B1 | 10/2004 | Staszewski et al. | |
| 7,053,727 B2 | 5/2006 | Nilsson | |
| 7,084,713 B2 | 8/2006 | Peluso | |

(Continued)

FOREIGN PATENT DOCUMENTS

| | | |
|---|---|---|
| DE | 102006011285 A1 | 9/2007 |
| EP | 0718963 A1 | 6/1996 |

(Continued)

OTHER PUBLICATIONS

Deveugele et al., "A 10b 250MS/s Binary-Weighted Current-Steering DAC," 2004 IEEE Solid-State Circuits Conference, Feb. 18, 2004, Belgium.

(Continued)

*Primary Examiner* — Adam Houston
(74) *Attorney, Agent, or Firm* — Kenyon S. Jenckes

(57) ABSTRACT

A method of performing modulation of a data signal at a phase-locked loop (PLL) includes generating, at an upper frequency port of the PLL, a digital loop signal based at least in part on the data signal. The method further includes differentiating the digital loop signal to generate a digital input signal and converting the digital input signal to an analog current signal. A first feedback signal is generated based on the analog current signal. The method further includes generating, at a lower frequency port of the PLL, a second feedback signal based on the first feedback signal and further based on the data signal. According to further embodiments, apparatuses and a computer-readable medium are disclosed.

25 Claims, 18 Drawing Sheets

(56) References Cited

U.S. PATENT DOCUMENTS

| | | | |
|---|---|---|---|
| 7,116,183 B2 | 10/2006 | Wu | |
| 7,230,504 B1 | 6/2007 | Marques et al. | |
| 7,280,001 B2 | 10/2007 | Maligeorgos et al. | |
| 7,349,514 B2 | 3/2008 | Meltzer et al. | |
| 7,403,750 B2 | 7/2008 | Rosnell et al. | |
| 7,414,557 B2* | 8/2008 | Andersson et al. | 341/143 |
| 7,443,206 B1 | 10/2008 | Fernandez | |
| 7,443,261 B2 | 10/2008 | Yoshikawa et al. | |
| 7,518,458 B2 | 4/2009 | Nakamura et al. | |
| 7,535,311 B2 | 5/2009 | Nergis | |
| 7,557,623 B2 | 7/2009 | Moehlmann et al. | |
| 7,557,624 B2* | 7/2009 | van der Valk et al. | 327/156 |
| 7,647,033 B2* | 1/2010 | Uozumi et al. | 455/260 |
| 7,764,127 B2 | 7/2010 | Sun et al. | |
| 7,805,122 B2* | 9/2010 | Lerner et al. | 455/255 |
| 7,809,338 B2* | 10/2010 | Tsfati | 455/76 |
| 7,936,221 B2* | 5/2011 | Staszewski et al. | 331/1 A |
| 7,999,622 B2* | 8/2011 | Galton et al. | 331/16 |
| 8,022,849 B2 | 9/2011 | Zhang et al. | |
| 8,076,960 B2 | 12/2011 | Geng et al. | |
| 8,339,165 B2* | 12/2012 | Dunworth et al. | 327/152 |
| 8,433,026 B2* | 4/2013 | Ballantyne et al. | 375/376 |
| 8,446,191 B2* | 5/2013 | Dunworth et al. | 327/156 |
| 2004/0036539 A1* | 2/2004 | Hammes et al. | 331/16 |
| 2004/0192231 A1 | 9/2004 | Grewing et al. | |
| 2004/0192369 A1 | 9/2004 | Nilsson | |
| 2004/0196924 A1* | 10/2004 | Wilson | 375/302 |
| 2005/0046488 A1 | 3/2005 | Grewing et al. | |
| 2005/0232385 A1 | 10/2005 | Yoshikawa et al. | |
| 2005/0286562 A1 | 12/2005 | Nakao et al. | |
| 2006/0033587 A1 | 2/2006 | Cabanillas | |
| 2006/0052073 A1 | 3/2006 | Yoshikawa et al. | |
| 2006/0171495 A1 | 8/2006 | Youssoufian | |
| 2006/0238261 A1 | 10/2006 | Rhee et al. | |
| 2007/0036238 A1 | 2/2007 | Matero et al. | |
| 2007/0085579 A1* | 4/2007 | Wallberg et al. | 327/156 |
| 2007/0152857 A1* | 7/2007 | Tu et al. | 341/143 |
| 2007/0165743 A1 | 7/2007 | McCallister | |
| 2007/0195917 A1 | 8/2007 | Landmark | |
| 2007/0205831 A1 | 9/2007 | Yoshikawa et al. | |
| 2008/0069286 A1* | 3/2008 | Staszewski et al. | 375/376 |
| 2008/0122504 A1* | 5/2008 | van der Valk et al. | 327/156 |
| 2008/0129406 A1 | 6/2008 | Nergis | |
| 2008/0205571 A1* | 8/2008 | Muhammad et al. | 375/376 |
| 2009/0010372 A1 | 1/2009 | Maeda | |
| 2009/0015338 A1 | 1/2009 | Frey | |
| 2009/0045993 A1* | 2/2009 | Tokumaru et al. | 341/136 |
| 2009/0097609 A1 | 4/2009 | Chang et al. | |
| 2009/0102564 A1 | 4/2009 | Ballantyne | |
| 2009/0102570 A1 | 4/2009 | Yoshida et al. | |
| 2009/0108891 A1 | 4/2009 | Sander et al. | |
| 2009/0153254 A1 | 6/2009 | Yu et al. | |
| 2009/0175399 A1 | 7/2009 | Sun et al. | |
| 2009/0207961 A1 | 8/2009 | Sai | |
| 2009/0219100 A1* | 9/2009 | Pullela et al. | 331/44 |
| 2009/0262877 A1* | 10/2009 | Shi et al. | 375/376 |
| 2009/0262878 A1 | 10/2009 | Sun et al. | |
| 2009/0267664 A1 | 10/2009 | Uozumi et al. | |
| 2009/0322439 A1 | 12/2009 | Mayer et al. | |
| 2010/0066421 A1 | 3/2010 | Geng et al. | |
| 2010/0097108 A1 | 4/2010 | Sugibayashi et al. | |
| 2010/0135368 A1* | 6/2010 | Mehta et al. | 375/219 |
| 2010/0141314 A1 | 6/2010 | Chen | |
| 2010/0195779 A1 | 8/2010 | Sai | |
| 2010/0245160 A1* | 9/2010 | Sakurai et al. | 342/200 |
| 2011/0133794 A1* | 6/2011 | Dunworth et al. | 327/156 |
| 2011/0133799 A1* | 6/2011 | Dunworth et al. | 327/157 |
| 2012/0049913 A1* | 3/2012 | Tadjpour | 327/157 |
| 2012/0190311 A1* | 7/2012 | Tadjpour | 455/73 |
| 2012/0201338 A1* | 8/2012 | Leung et al. | 375/376 |
| 2013/0050013 A1* | 2/2013 | Kobayashi et al. | 342/118 |
| 2013/0093524 A1* | 4/2013 | Nakamura | 331/34 |
| 2013/0121444 A1* | 5/2013 | Wojtiuk | 375/300 |

FOREIGN PATENT DOCUMENTS

| | | |
|---|---|---|
| EP | 0899866 A1 | 3/1999 |
| JP | 8222955 A | 8/1996 |
| JP | 2005072874 A | 3/2005 |
| JP | 2005287010 A | 10/2005 |
| WO | 0152401 A1 | 7/2001 |
| WO | 2004068697 A1 | 8/2004 |
| WO | 2008005853 | 1/2008 |

OTHER PUBLICATIONS

International Search Report—PCT/US2007/085541, International Searching Authority, European Patent Office—Mar. 14, 2008.

International Search Report and Written Opinion—PCT/US2010/033044, International Search Authority—European Patent Office—Oct. 5, 2010.

International Search Report and Written Opinion—PCT/US2010/059337, International Search Authority—European Patent Office—Feb. 25, 2011.

International Search Report and Written Opinion—PCT/US2010/059338, International Search Authority—European Patent Office—Mar. 3, 2011.

Keese, "An Analysis and Performance Evaluation of a Passive Filter Design Technique for Charge Pump Phase-Locked Loops," National Semiconductor Application Note 1001, pp. 1-8, May 2006.

Lau, et al., "Fractional-N Frequency Synthesizer Design at the Transfer Function Level Using a Direct Closed-Loop Realization Algorithm," Design Automation Conference 2003, pp. 526-531, Jun. 2-6, 2003, Anaheim, California, USA.

Pamarti, et al., "A wideband 2.4GHz delta-sigma fractional-N PLL with 1-Mb/s in-loop modulation", IEEE Journal of Solid-State Circuits, pp. 49-62, vol. 39, No. 1, Jan. 2004.

Partial International Search Report, PCT/US2010/033044—International Search Authority—European Patent Office, Jul. 19, 2010.

Sander, et al., "Polar Modulator for Multi-mode Cell Phones," IEEE 2003 Custom Integrated Circuits Conference, pp. 439-445, Cupertino, CA, USA.

Si, et al., "A Single-Chip CMOS Bluetooth v2.1 Radio SoC," IEEE Journal of Solid-State Circuits, vol. 43, No. 12, pp. 2896-2904, Dec. 10, 2008, Santa Clara, CA, USA.

Staszewski, et al., "Digital RF Processor (DRPtm) for Cellular Phones," 2005 IEEE, pp. 122-129, Dallax, TX, USA.

Volodymyr Kratyuk et al: "A Design Procedure for All—Digital Phase-Locked Loops Based on a Charge-Pump Phase-Locked-Loop Analogy" IEEE Transactions on Circuits and Systems 11: Express Briefs, IEEE Service Center, New York, NY, US LNKDDOI:10.1109/TCSII.2006.889443, vol. 54, No. 3, Mar. 1, 2007, pp. 247-251, XP011175096 ISSN: 1057-7130.

* cited by examiner

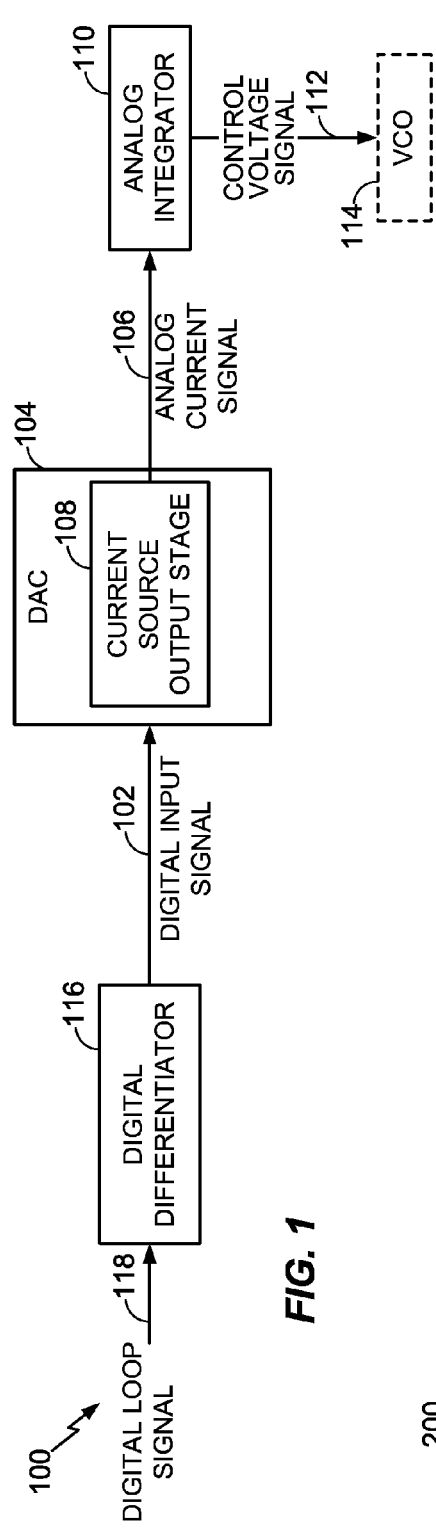
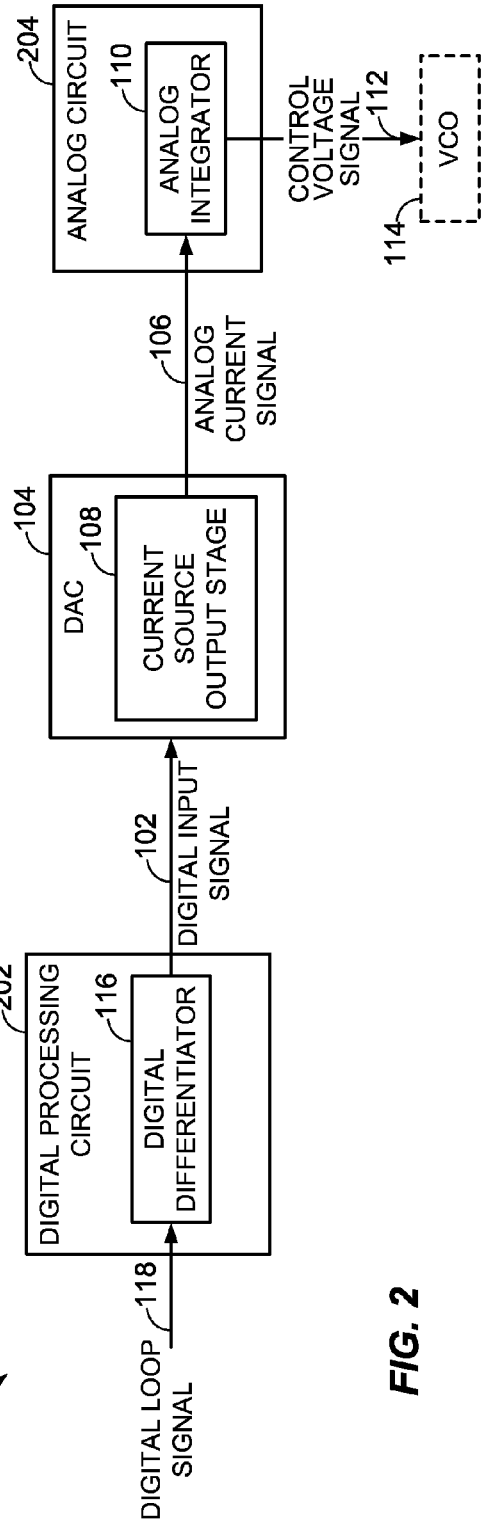

US 8,531,219 B1

PHASE LOCKED LOOP WITH DIGITAL COMPENSATION FOR ANALOG INTEGRATION

CROSS-REFERENCE TO RELATED APPLICATIONS

The present application is a continuation of and claims the benefit of U.S. patent application Ser. No. 12/632,053, filed Dec. 7, 2009 and entitled "PHASE LOCKED LOOP WITH DIGITAL COMPENSATION FOR ANALOG INTEGRATION," and is related to U.S. patent application Ser. No. 12/632,061, filed Dec. 7, 2009 and entitled "CONFIGURABLE DIGITAL-ANALOG PHASE LOCKED LOOP," now U.S. Pat. No. 8,339,165, each application of which is assigned to the assignee hereof and is expressly incorporated by reference herein.

TECHNICAL FIELD

The present invention relates generally to phase locked loops, and more specifically to phase locked loops with a digital compensation for analog integration.

BACKGROUND

Phase-locked loops (PLLs) generate signals relative to a reference signal. The phase-locked loop circuit adjusts a frequency of a PLL output signal based on differences in phase and/or frequency of the reference signal and the output signal. The frequency of the output signal is increased or decreased based on the difference. The phase-locked loop is, therefore, a control system using negative feedback. Phase-locked loops are used in electronics such as radios, telecommunication circuits, and computers as well as other devices.

PLLs often use a resonant-tuned voltage controlled oscillator (VCO) to generate the PLL output signal. A resonant tuned VCO often includes a capacitive device and a resonant inductor-capacitor (LC) circuit. The capacitive device typically includes at least one varactor having a capacitance that responds to a tuning voltage to change the frequency of the PLL output signal.

Some conventional PLL include one more digital components. Such PLLs have advantages over analog loops in some respects. Unfortunately, these PLLs also have some disadvantages. Accordingly, there is need for a PLL that has advantages of both analog and digital loops.

SUMMARY

A phase locked loop (PLL) device includes a digital differentiator configured to differentiate a digital loop signal to at least partially compensate for the integration of an analog current signal by an analog integrator. A digital to analog converter (DAC) includes a current source output stage that generates the analog current signal based on an digital input signal, The analog integrator integrates the analog current signal to generate a voltage control signal for controlling a voltage controlled oscillator (VCO).

BRIEF DESCRIPTION OF THE DRAWINGS

FIG. 1 is a block diagram of a forward portion of a phase locked loop device in accordance with an exemplary embodiment of the invention.

FIG. 2 is a block diagram of the forward portion of the PLL device where the digital differentiator is implemented as part of a digital processing circuit and the analog integrator is implemented as part of an analog circuit.

DETAILED DESCRIPTION

Figure 3:
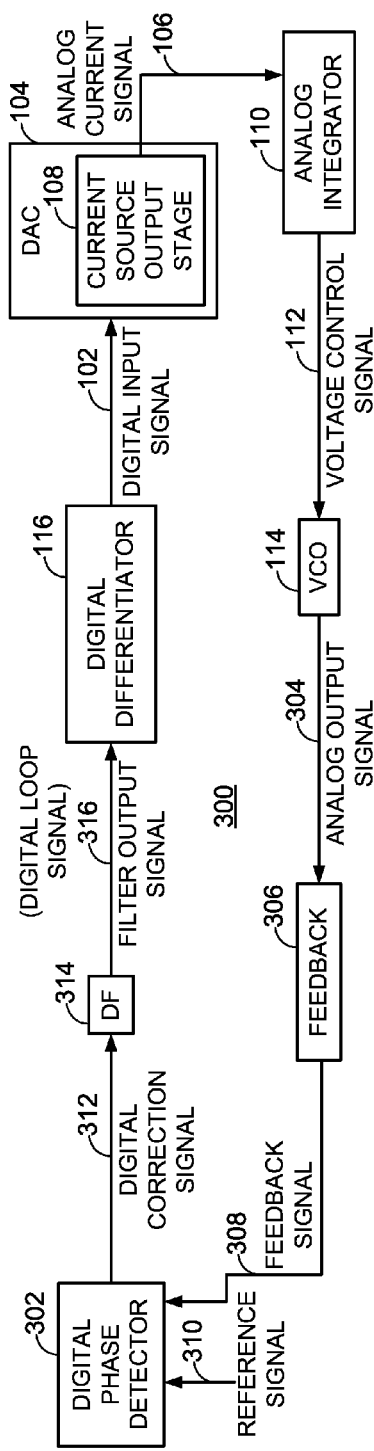
FIG. 3 is a block diagram of a PLL device in accordance with the exemplary embodiment including a digital phase detector.

The word "exemplary" is used herein to mean "serving as an example, instance, or illustration." Any embodiment described herein as "exemplary" is not necessarily to be construed as preferred or advantageous over other embodiments.

FIG. 1 is a block diagram of a forward portion 100 of a phase locked loop device in accordance with an exemplary embodiment of the invention. A digital input signal 102 is processed by a current output digital to analog converter (current output DAC) 104 to generate an analog current signal 106. The analog current signal 106 provided by a current source output stage 108 of the current output DAC is integrated by an analog integrator 110 before being applied as a control voltage signal 112 to an analog voltage controlled oscillator (VCO) 114. A digital differentiator 116 processes a digital loop signal 118 to form the digital input signal 102 and at least partially compensates for the integration performed by the analog integrator 110. As described below, the digital loop signal 118 is based on a difference between a feedback signal and a reference signal within the PLL. The content of the digital loop signal depends on the particular implementation of the PLL. For example, where the PLL includes modulation functionality, the digital loop signal may include data. Further, a digital filter may be connected between a phase detector and the digital differentiator such that the digital loop signal may be a filtered signal based on difference between the feedback signal and reference signal. As discussed below with reference to FIG. 2, the digital differentiator may be implemented as part of other digital processing circuitry where the digital loop signal may be interpreted as a signal or combination of signals being processed with the digital processing circuitry.

The current output DAC 104 is any device that receives a digital input signal and generates an analog current signal where the analog current signal is provided by a current source output stage 108. The current source output stage 108 is implemented using active devices such as transistors. Examples of suitable current output DACs are discussed below with reference to FIG. 11, FIG. 12, FIG. 13A and FIG. 13B.

The analog integrator 110 is any device or arrangement that performs an integration function of the analog current signal 106. An example of a suitable analog integrator 110 is a capacitor. The digital differentiator 116 is any device or processor that differentiates the digital loop signal 118. Therefore, the digital differentiator may be any device or circuit that performs a difference equation function where the output is based on previous inputs. Examples of suitable digital differentiators include devices that perform a difference equation such as $y[t]=x[t]-x[t-1]$ where y is the output, x is the input and t is the sample time and t−1 is the previous sample time. Such a function can also be expressed in the Z-domain as $1-z^{-1}$.

During operation, the current output DAC 104 converts the digital input signal 102 to the analog current signal 106. The analog integrator 110 integrates the analog current signal 106 to generate a control voltage signal 112. Where the analog integrator 110 is a shunt capacitor to ground, for example, a voltage is generated across the capacitor in accordance with the integral of the analog current signal 112. The VCO output signal (analog output signal) has a frequency based on the control voltage signal 112. The VCO output signal is fed back and compared to a reference signal to generate a signal where the digital loop signal 118 is at least partially based on the generated signal. The digital differentiator 116 processes the digital loop signal 118 to at least partially compensate for the integration of the analog integrator 110.

Many conventional phase lock loops (PLLs) do not include a DAC in the forward portion of the PLL and all of the loop filtering is performed in either the analog or digital domain. Some conventional PLLs which include a DAC in the forward portion of the PLL follow the DAC with a low pass filter instead of an integrator. Discussions regarding PLLs with DACs followed by a low pass filter can be found in U.S. Pat. Nos. 5,999,060, 6,094,101, and 6,188,288, as well as United States Publication Numbers 2009/0010372, 2007/0195917, and 2007/0036238. An example where a DAC output is connected directly to the VCO without either an integrator or a low pass filter is discussed in U.S. Pat. No. 5,648,964. Other PLLs which include a DAC in the forward portion of the PLL and follow the DAC with an integrator use a DAC with voltage mode output. Such examples are discussed in U.S. Pat. No. 6,094,101 and United States Patent Publication Number 2009/0108891. As a consequence, conventional PLL techniques require separate DACs for the forward path of the loop and the high pass modulation input when two point modulation is applied to the PLL FIG. 2 is a block diagram of the forward portion 200 of a PLL device where the digital differentiator 116 is implemented as part of a digital processing circuit 202 and the analog integrator 110 is implemented as part of an analog circuit 204. The digital processing circuit 202 within the PLL may include any of various digital processing functions such as digital filtering, PLL bandwidth control, establishment of a frequency response appropriate to ensure PLL control system stability, and spur and noise cancellation. The digital processing circuit 202 may accept additional inputs to those shown in the figures. For example, spur and noise cancellation functions may require additional inputs. Therefore, at least a portion of the digital processing circuit 202 includes a digital filter. In the exemplary embodiment, the digital filter performs all the functions associated with an analog loop filter in a conventional analog PLL such as bandwidth control, stability control, step input damping response, and lock time control while also enabling additionally programmability and flexibility for noise and spur cancelling not available in traditional analog filters.

The digital processing circuit 202 also includes at least a portion that performs a differentiation function. Accordingly, the digital differentiator 116 digitally processes the digital signal to generate the derivative of the digital loop signal. Although other processing is performed by the digital processing circuit, the digital differentiator 116 at least partially compensates for the analog integration performed by the analog integrator 110.

For the example of FIG. 2, the analog integrator 110 is part of an analog circuit 204. The analog circuit 204 may be a capacitor, or may be a capacitor followed by cascaded RC sections where the frequency response associated with the RC sections is flat at low frequencies where the digital filter operates and provides attenuation at frequencies much higher than the digital filter. The additional filtering from the cascaded RC sections could also be provided by active filter circuits, provided that the frequency response meets the above condition of being low-pass where the low-pass corner significantly exceeds the frequency of the dominant poles in the digital loop filter. The effect of the analog circuit 204 includes an integration function. Accordingly, the analog integrator may be part of an analog filter in some implementations.

In some circumstances, the analog integrator is a standalone circuit or element and the digital differentiator is part of digital processing circuitry. In other circumstances, the digital differentiator is a standalone device and the analog integrator is implemented as part of an analog circuit that performs other functions.

FIG. 3 is a block diagram of a PLL device 300 in accordance with the exemplary embodiment including a digital phase detector 302. The VCO generates the analog output signal 304 which is fed back through a feedback 306 portion of the PLL. The feedback 306 may include prescalers, dividers, and/or other processing, depending on the particular implementation. The resulting feedback signal 308 is received at the digital phase detector 302 where the feedback signal 308 is compared to a reference signal 310. The digital phase detector 302 generates a digital correction signal 312 that is based on the difference between the phase of the feedback signal 308 and the phase of the reference signal 310. The digital phase detector 302 is any device that can generate a digital number signal based on the phase difference of the two input signals. An example of a suitable implementation of the digital phase detector 302 includes using a phase to digital converter (PDC). In such an implementation, the feedback signal and the reference signal are typically analog signals. The PDC counts the number of inverter delays between the rising edge of a reference signal 310 and the rising edge of a divided feedback signal 312. A phase detector portion of the PDC generates an output pulse whose duration corresponds to the difference between the rising edge of the reference signal and the rising edge of the divided feedback signal. The time duration of the pulse is an error signal representative of the difference between the phase of the reference and the phase of the divided feedback signal. The time duration of the pulse is then converted to a digital number in a time to digital converter (TDC) to produce the digital correction signal. The digital loop signal 118 is based on the digital correction signal 312. As described below, modulation ports and other processing may be inserted between the digital phase detector and the digital differentiator. Accordingly, although the digital loop signal received by the digital differentiator is based on the digital correction signal, it is typically not be the same signal. Typically at least some digital filtering function is inserted between the digital phase detector and the digital differentiator 116. For the example, a digital filter 314 filters the digital correction signal 312 to generate a filter output signal 316 forming the digital loop signal 118. The digital filter 314 performs all the functions associated with an analog loop filter in a conventional analog PLL such as bandwidth control, stability control, step input damping response, and lock time control while also enabling additionally programmability and flexibility for noise and spur cancelling not available in traditional analog filters.

Another example of a suitable implementation of the digital phase detector 302 includes using a time to digital convertor (TDC) and a phase accumulator in the feedback. In such an implementation, the feedback signal and the reference signal are digital signals. The feedback provides a digital feedback signal based on the analog output signal of the VCO. More specifically, the phase accumulator counts the integer number of VCO analog output cycles and the TDC counts the number of inverter delays within a fraction of a period of the VCO analog output signal. The output of a phase accumulator is combined with a normalized digital number signal generated by the TDC. Therefore, in this example, the feedback signal consists of a fractional phase provided by the TDC in the feedback and the integer phase provided by the phase accumulator. The integer phase is the total number of complete RF cycles of the VCO analog output signal during one or more reference signal periods. The total phase indicated in the feedback signal and provided to the phase detector is then the sum of the fractional and integer phase. The digital phase detector generates a digital corrections signal based on the phase difference between the feedback signal and the reference signal.

Figure 4:
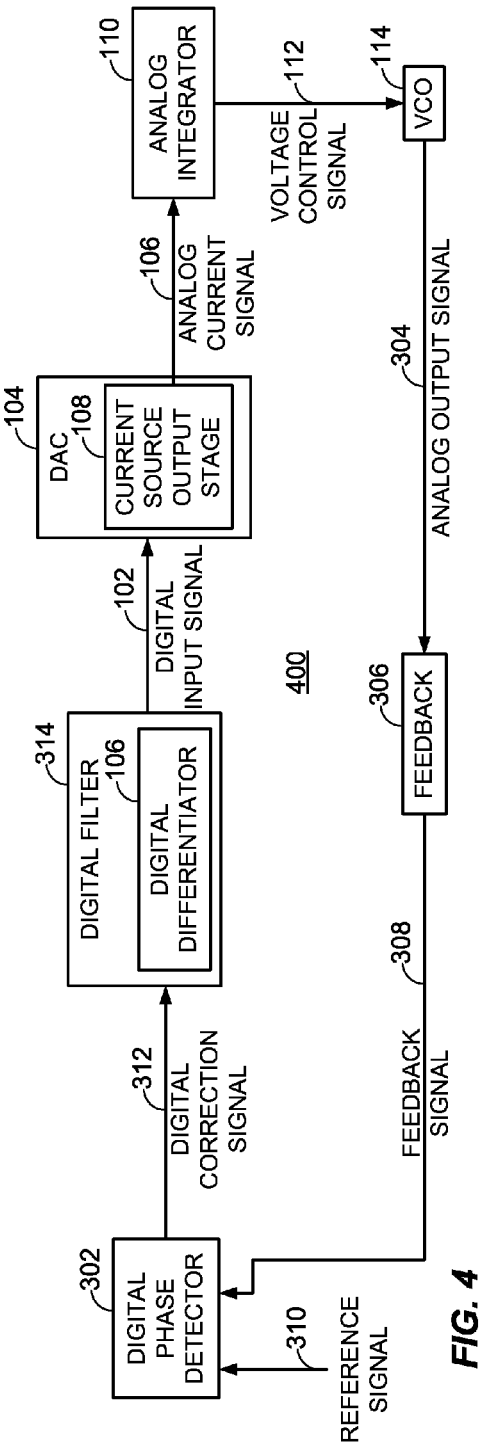
FIG. 4 is a block diagram of a PLL device where the digital differentiator is implemented as part of the digital filter.

FIG. 4 is a block diagram of a PLL device 400 where the digital differentiator 116 is implemented as part of the digital filter 314. The PLL device 400 of FIG. 4 operates as discussed above except that the differentiation function is performed by a device that also performs the digital loop filtering. The digital correction signal 312 is processed by the digital filter 314. The result of the processing includes at least a partial compensation of the analog integration performed by the analog integrator 110. The digital loop signal 118 in this example is a signal or combination of signals processed by the digital filter 314.

Figure 5:
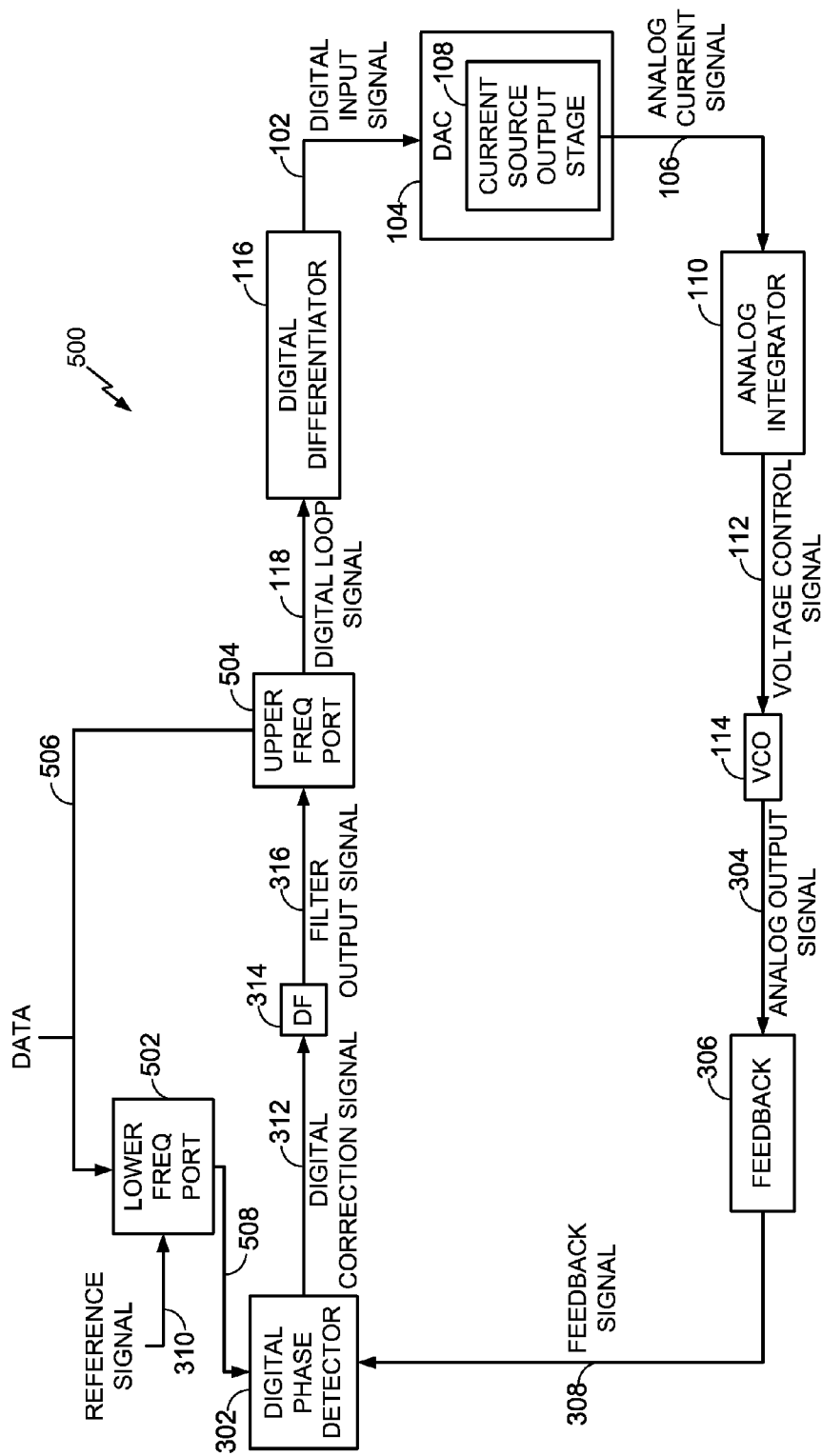
FIG. 5 is a block diagram of a PLL device in accordance with the exemplary embodiment including two point modulation having a low frequency port in the reference path.

FIG. 5 is a block diagram of a PLL device 500 in accordance with the exemplary embodiment including two point modulation having a low frequency port 502 in the reference path. The two point modulation interface includes a lower frequency port and 502 an upper frequency port 504. The lower frequency port 502 is coupled within the reference branch of the PLL. Data 506 is combined with the reference signal 310 before the digital phase detector 302. As described below in further detail, the combination may include a summation of the two signals or may include other forms of combining the data 506 with the reference signal 310. The combined signal 508 is compared to the feedback signal 308 by the digital phase detector 302 to generate the digital correction signal 312. The digital filter 314 filters the digital correction signal 312 to provide a filter output signal 316. The upper frequency port 504 couples the data with the filter output signal 316. As described below, a summer is used to combine the data signal 506 and the filter output signal 316 in the exemplary embodiment. Other techniques for combining the two signals, however, can be used in some circumstances. The digital loop signal 118 is based on the combined data and filter output signal. Other processing may be performed before the digital loop signal 118 is presented to the digital differentiator 116. A gain adjustment, for example, may be applied. The current output DAC 104 generates the analog current signal based on the digital loop signal 118 which is based on the differentiated combined data and filter output signal. The analog integrator 110 integrates the analog current signal 106 to provide the voltage control signal to the VCO 114. The feedback 306 couples the signal back to the digital phase detector.

Figure 6:
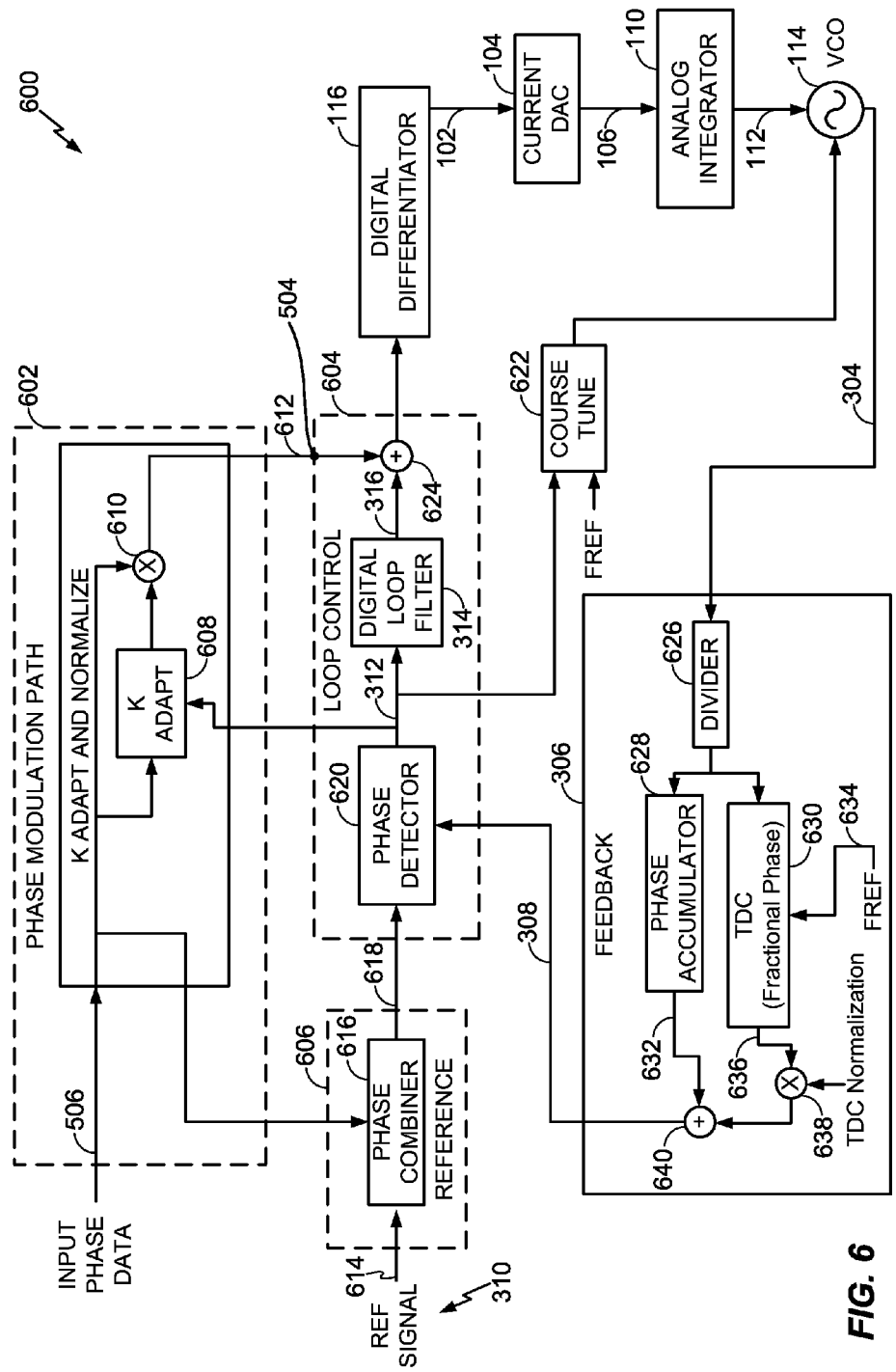
FIG. 6 is a block diagram of an exemplary implementation of the PLL device of FIG. 5.

FIG. 6 is a block diagram of an exemplary implementation 600 of the PLL device 500 of FIG. 5. The exemplary implementation 600 includes a phase modulation section 602, a loop control section 604, a reference section and a feedback 306.

The phase modulation section 602 enables two point modulation by processing and introducing the data 506 into the PLL at two points. In some circumstances, the input phase data 506 is received and processed by interface blocks (not shown) which provide any required signal buffering, clock rate conversion and bitwidth adjustments to the input phase data. The resulting processed data is provided to the reference path and is further processed by the gain adaptation 608 and normalization device 610 before injection into the loop control section 604. The loop gain adaptation device 608 measures the difference between actual and expected analog loop gain resulting from the current to voltage gain in the analog integrator, the voltage to frequency gain in the VCO and any gain error in the DAC. The resulting loop gain difference is then multiplied with the processed input phase data by the loop gain normalizing device 610. The normalized data 612 is then combined with the digital loop filter output signal 316 and injected into the loop control path. Accordingly, the gain adaptation and normalization section 602 establishes equal passband gain from input phase data to the VCO output for the low pass modulation path through the reference section 606 and the high pass modulation section 504.

The reference section 606 may include any number of circuits and devices to couple a reference signal combined with data to the loop control section 604. The reference signal 310 is a digital reference signal 614 that may be received at the reference path as an integer portion and a fractional portion in some circumstances. The reference signal is combined with a data signal that is received at the phase modulation path and that may be at least partially processed by the interface blocks which provide any required signal buffering, clock rate conversion and bitwidth adjustments to the input phase data. A phase combiner 616 combines the two signals to generate a combined signal 618 that, in some circumstances, may be further processed before the signal is provided to the loop control section 604. Although the phase combiner 616 is a summer in the exemplary embodiment, other techniques may be used to combine data with the reference signal in some circumstances.

The digital phase detector 620 in the loop control section 604 compares the combined signal 618 to the feedback signal 308 received from the feedback 306. For the example of FIG. 6, the digital phase detector is digital phase detecting device that provides a digital correction signal based on a phase difference between two digital signals. Accordingly, the feedback signal 308 and the combined signal 618 are both digital signals in this example. A digital correction signal 312 is provided to the digital loop filter 314, the loop gain adaptation device 608 of the phase modulation section and to a course tuning mechanism 622. The digital loop filter 614 filters the digital correction signal 312 to provide the filtered signal 316 to the summer 624. The summer 624 combines the higher frequency data 612 received from the phase modulation section 602 with the filtered signal 316 to generate the digital loop signal 118 including data information. The digital differentiator 116 at least partially compensates for the integration by the analog integrator 110 to provide the digital input signal 102 to the current output DAC 104. The current output DAC 104 converts the digital input signal 102 to the analog current signal 106. Where the current output DAC 104 is a current pulse DAC, the analog current signal 106 is a series of identical, or nearly identical, pulses having polarity that corresponds to the sign of the digital loop signal 118. Where the current output DAC 104 is a current steering DAC with a current minor output stage, the analog current signal 106 is a continuous time-varying current signal corresponding to the input signal. The analog current signal 106 is integrated by the analog integrator 110 to provide the VCO 114 with an analog control voltage signal 112. The VCO 114 generates an analog VCO output signal (analog output signal) 304 in accordance with the voltage control signal 112.

The analog output signal 304 is split into two portions by a signal divider 626 where one portion is received by a phase accumulator 628 and another portion is received at a TDC 630. The phase accumulator 628 converts the analog output signal 304 to an integer value 632 representing an integer portion of the phase of the analog output signal 304 expressed as a digital number. The TDC 630 compares the analog output signal 304 to a frequency reference (FREF) 634 to determine a fractional portion of the digital representation of the phase. This digital number 636 representing the fractional portion is normalized by the normalizing device 638 before the integer portion and the fractional portion are combined in the combiner 640 to form the digital feedback signal 308. The frequency reference (FREF) 634 is typically a single bit pulse generated every reference cycle and indicates the frequency of the reference signal. The phase of the reference signal is also represented as a digital number at the reference section 606 input and is incremented by a fixed amount once per reference period.

Figure 7:
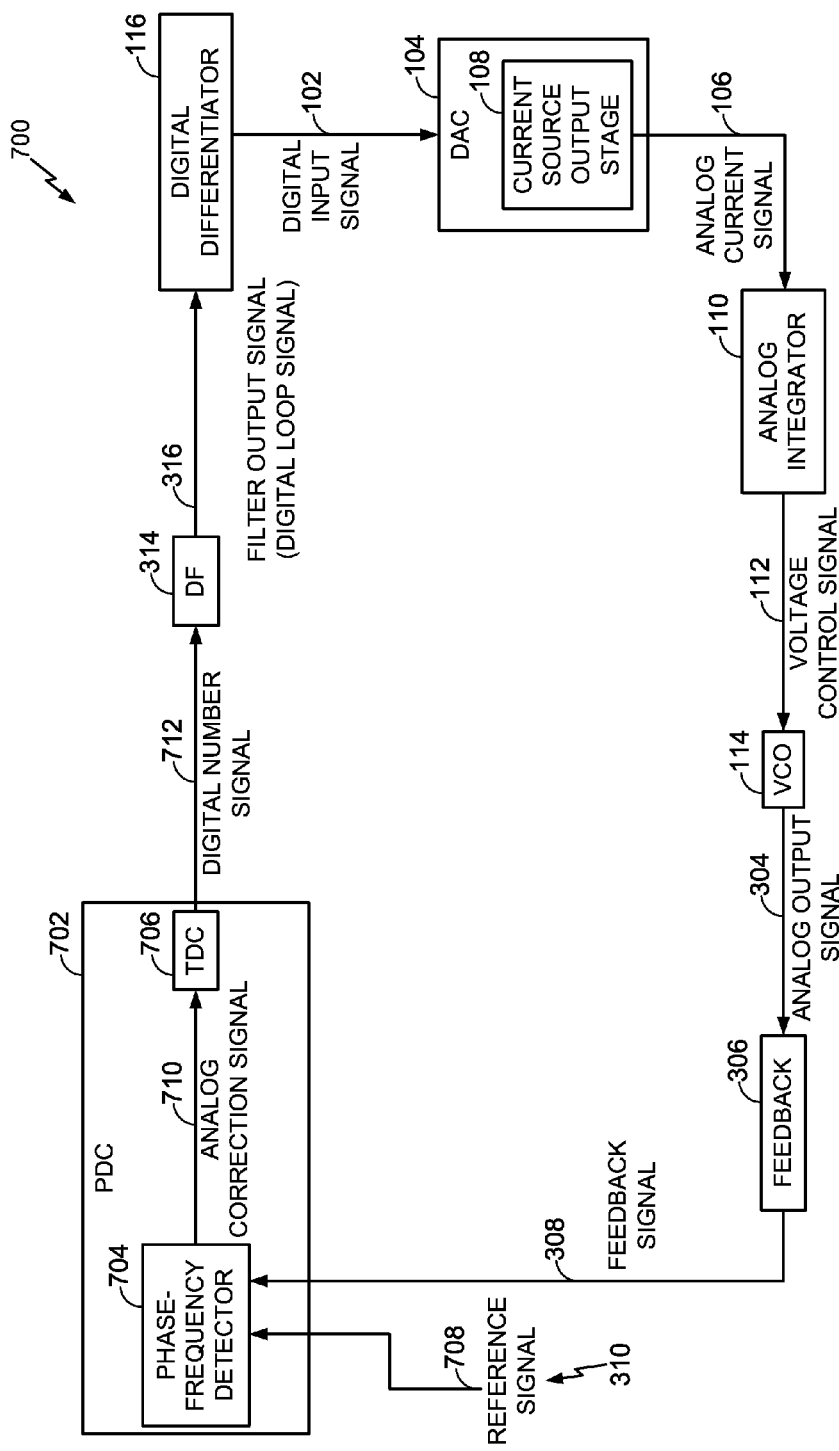
FIG. 7 is a block diagram a PLL device in accordance with the exemplary embodiment including a phase to digital converter (PDC).

FIG. 7 is a block diagram a PLL device 700 in accordance with the exemplary embodiment including a phase to digital converter (PDC) 702. In this exemplary implementation, the PDC 702 includes a phase-frequency detector 704 and a time to digital converter (TDC) 706. The VCO 114 generates the analog output signal 304 which is fed back through a feedback section 306 of the loop. The feedback 306 may include prescalers, dividers and other processing. The resulting feedback signal 308 is received at the phase-frequency detector 704 where the feedback signal 308 is compared to an analog feedback signal 708 (310). Accordingly, for the example of FIG. 7, the reference signal 310 is an analog reference signal 708 and the feedback signal 308 is an analog reference signal. The phase-frequency detector 704 generates an analog correction signal 710 that is based on the difference between the phase of the feedback signal and the phase of the reference signal. Because of the relationship between phase and frequency, the analog correction signal is also based on the frequency difference between the feedback signal and the reference signal. The TDC 706 counts the number of inverter delays within a fraction of a period of the analog correction signal 710 during which the analog correction signal 710 is asserted to generate a digital number signal 712. The digital number signal 712 is applied to a digital filter 314 to generate the filter output signal 316. For the example of FIG. 7, the filter output signal 316 is the digital loop signal 118. The filtered signal may be further processed by other devices to generate the digital loop signal 118. The digital loop signal 118 is at least based on the digital number signal 712. Other processing in addition to the digital filter 314 may be performed between the PDC 702 and the digital differentiator 116. Accordingly, the digital number signal 712 and the digital loop signal 118 are not identical signals in most circumstances. The current DAC 104 generates the analog current signal 106 based on the digital loop signal 118. The analog integrator 110 integrates the analog current signal 106 to provide the voltage control signal 112 to the VCO 114. The feedback couples 306 a signal that is based on the VCO output signal 304 back to the phase-frequency detector 704. The digital differentiator 116 at least partially compensates for the integration function of the integrator 110. Accordingly digital processing in the PLL compensates for the analog integration of the analog current signal.

Figure 8:
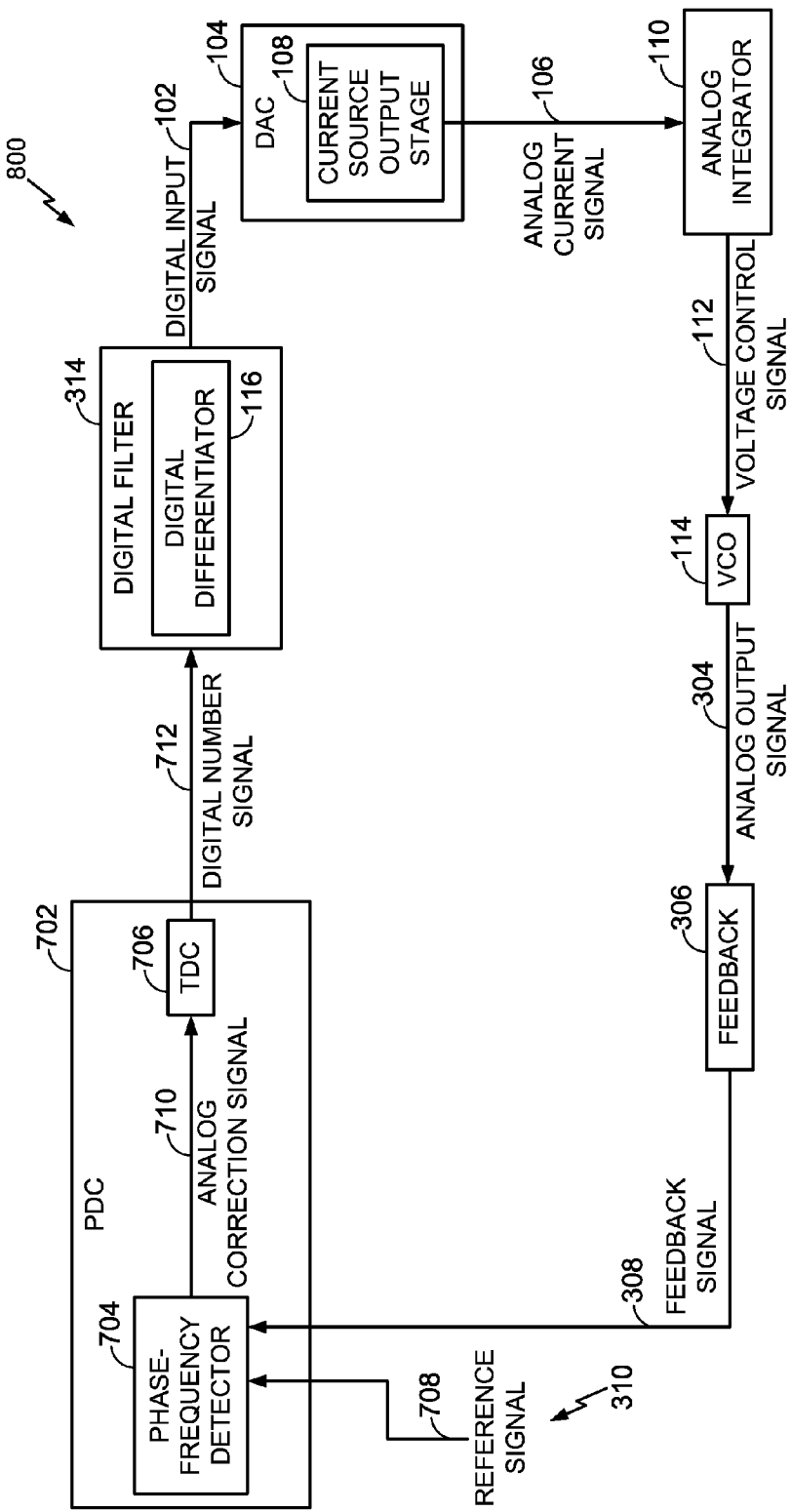
FIG. 8 is a block diagram of a PLL device including a phase to digital converter (PDC) where the digital differentiator is implemented as part of the digital filter.

FIG. 8 is a block diagram of a PLL device 800 including a phase to digital converter (PDC) 702 where the digital differentiator 116 is implemented as part of the digital filter 314. The PLL device 800 of FIG. 8 operates as discussed above except that the differentiation function is performed by a device that also performs the digital loop filtering. The digital number signal 712 is processed by the digital filter 314. The result of the processing includes at least a partial compensation of the analog integration performed by the analog integrator 110. The digital loop signal 118 in this example is a signal or combination of signals processed by the digital filter 314 within the digital filter device.

Figure 9:
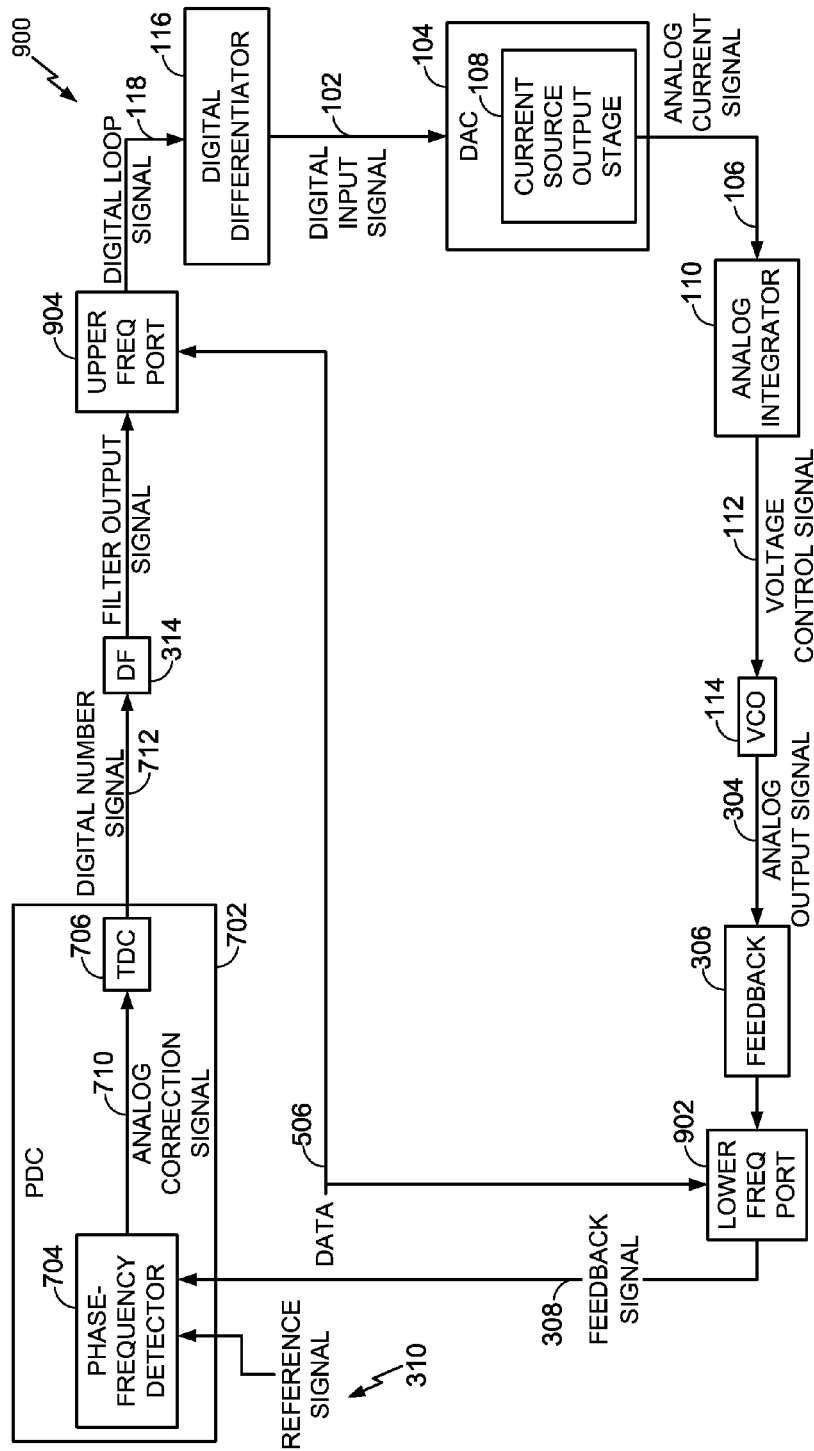
FIG. 9 is a block diagram of a PLL device in accordance with the exemplary embodiment including two point modulation having a lower frequency port in the feedback path.

FIG. 9 is a block diagram of a PLL device 900 in accordance with the exemplary embodiment including two point modulation having a lower frequency port 902 in the feedback path. In addition to the operations discussed above, the PLL of FIG. 9 includes two point modulation where a lower frequency port is connected in the feedback path and an upper frequency port 904 is connected after the digital filter 314. Accordingly, lower frequency data is coupled into the feedback path and higher frequency data is injected in the loop after the digital filter 314. The current DAC 104 generates the analog current signal 112 based on the digital loop signal 118 which is based on the differentiated combined data and filter output signal. The PDC 702 receives a feedback signal 308 that includes data. As a result, the VCO output signal 304 is modulated by the lower and higher frequency data creating an all pass transfer function.

Figure 10:
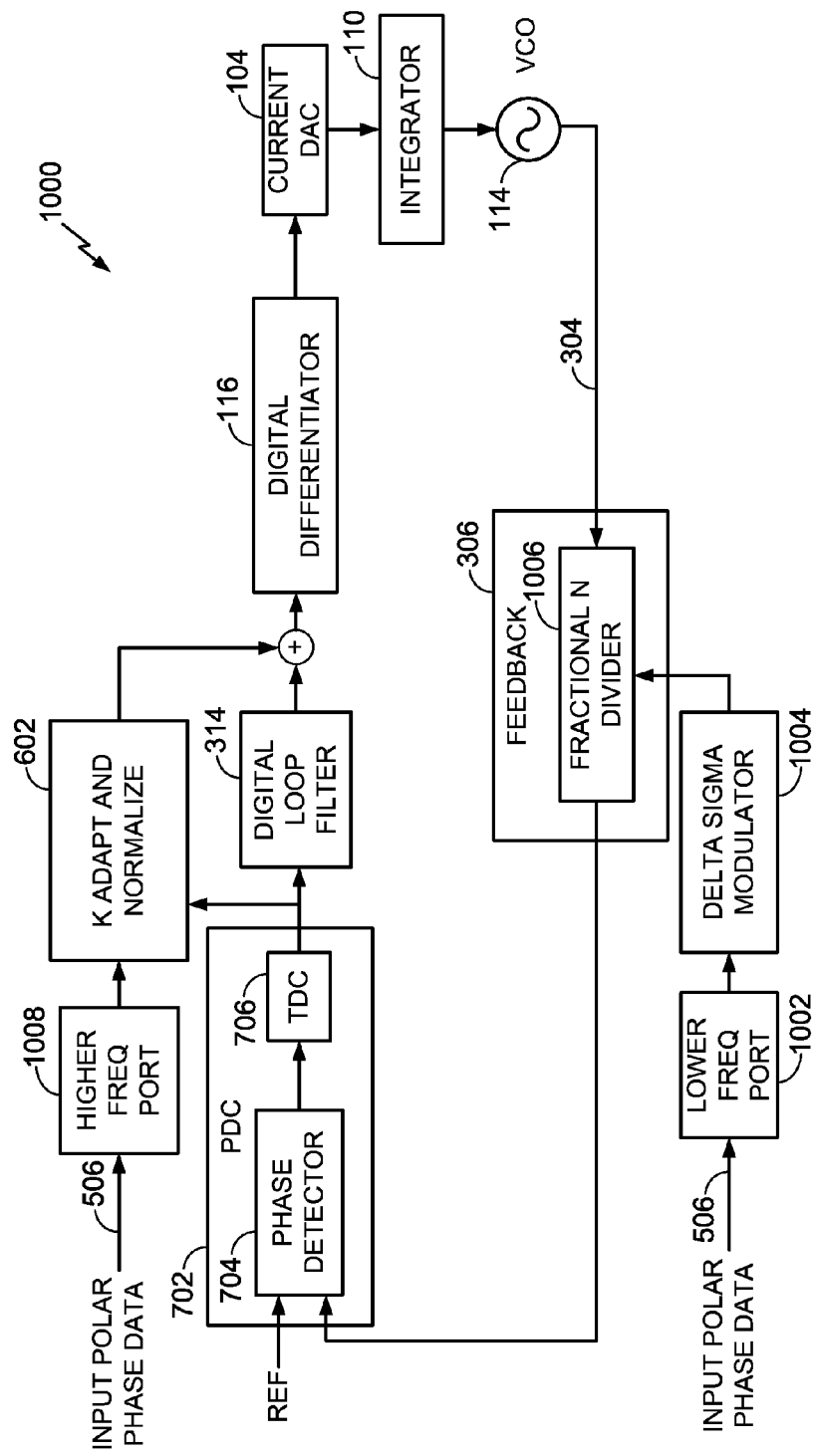
FIG. 10 is a block diagram of a PLL device in accordance with the exemplary embodiment including two point modulation having a sigma delta modulation lower frequency port in the feedback path.
Figure 11:
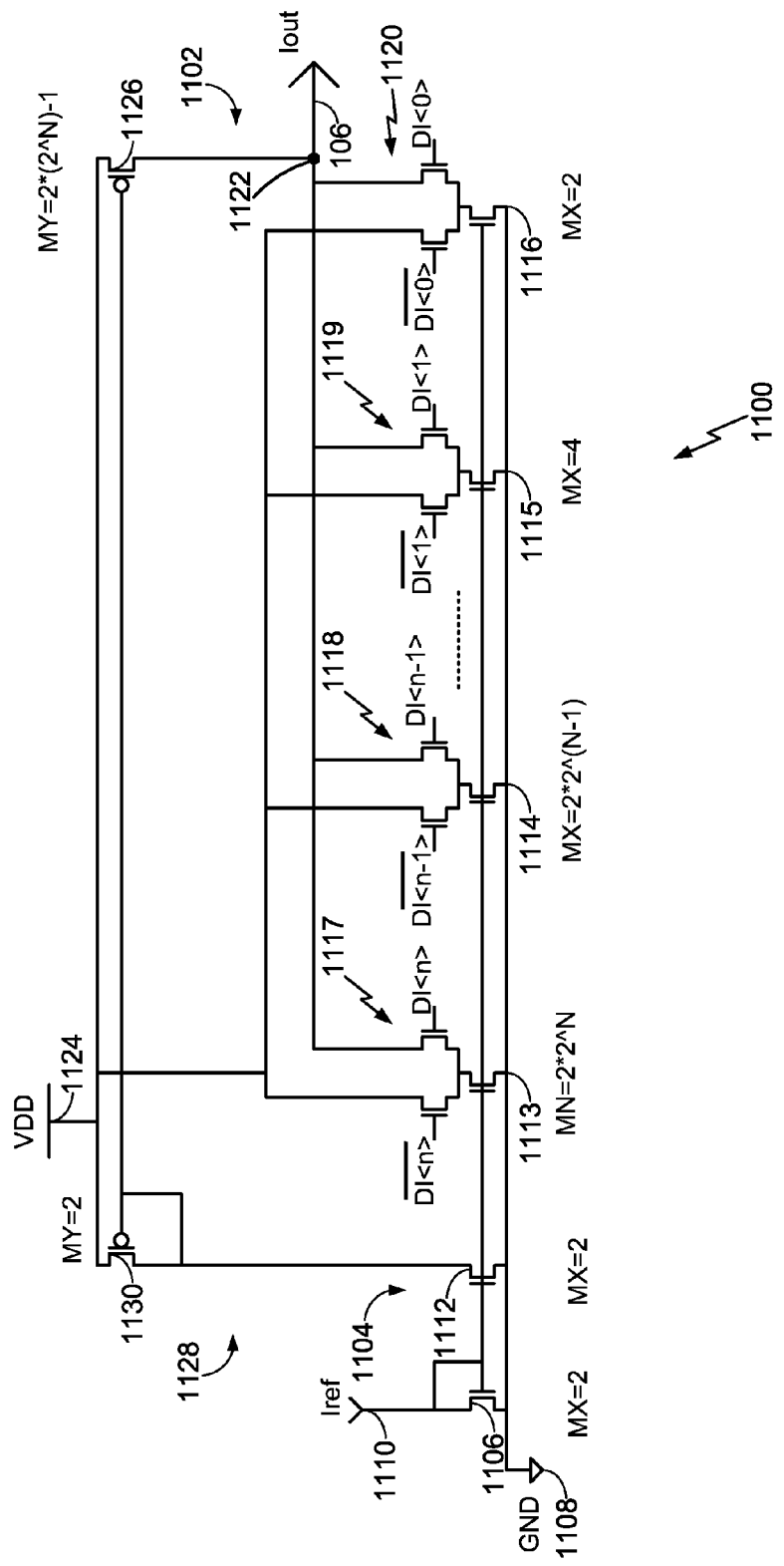
FIG. 11 is a schematic representation of a current steering DAC with a current source output stage.

FIG. 10 is a block diagram of a PLL device 1000 in accordance with the exemplary embodiment including two point modulation having a sigma delta modulation lower frequency port 1002 in the feedback 306 path. The input phase data 506 is applied to two points in the PLL creating an all pass transfer function from input phase data to modulation VCO output. The lower frequency modulation port 1002 is at the input of the feedback divider delta sigma modulator 1004. The feedback 306 includes a fractional N divider 1006. By causing the feedback division ratio to vary with the input phase data, the input phase modulation within the bandwidth of the PLL is transferred to the VCO output 304. The higher frequency modulation port 1008 is applied to the gain adaptation and normalization device 602. As described above, the gain adaptation and normalization device 602 measures the phase error input to the digital loop filter 314 to estimate the variation between actual and expected analog gains of the current mode DAC 104, analog integrator 110 and VCO voltage to frequency gain and applies a scaling factor to the input phase data 506. The gain adjusted signal including the phase data combined with the output of the digital loop filter 314 in the combiner 610. This creates the high frequency modulation path which transfers input phase modulation outside the bandwidth of the PLL to the VCO output 304. In circumstances where the digital differentiation is included in the digital loop filter 314, the input phase data applied to the gain adaptation and normalization device 602 is digitally differentiated before being summed with the digitally differentiated digital filter output FIG. 11 is a schematic representation of a current steering DAC 1100 with a current source output stage 1102. For the example, the digital input word is DI<n:0>. MY indicates the relative size between PMOS transistors and MX indicates the relative size between NMOS transistors. Iref is an input current bias. The exemplary current source output stage 1102 is implemented using active devices such as transistors. The output stage discussed with reference to FIG. 11 includes a current mirror 1104 having a reference input NMOS transistor 1106 where the source of the reference input NMOS transistor 1106 is connected to ground 1108. The drain and gate of the input reference NMOS transistor are connected to a reference current input 1110. The reference input NMOS transistor 1106 generates a reference voltage at the drain and gate nodes. The reference voltage is coupled to the gates of a plurality of NMOS transistors 1112-1116. In some situations, the plurality of NMOS transistors 1113-116 have sources connected to ground, and drains each individually connected to the sources of NMOS differential pairs 1117-1120. One drain output of each differential pair is connected to the DAC output 1122 and the other can be connected to a dump node, such as power supply 1124. The DAC output 1122 is biased with a PMOS current source 1126 of a PMOS current mirror 1128. The PMOS current mirror includes the current source 1126 and a reference device 1130, where the current source 1126 which provides half of the maximum current that can be provided by the NMOS current sources 1112-1116 when all current sources are switched to the output 1122. By programming the gate inputs to the differential pairs, the DAC output value is set according to how many NMOS current source to differential pair outputs are programmed to switch to the DAC output 1122.

Figure 12:
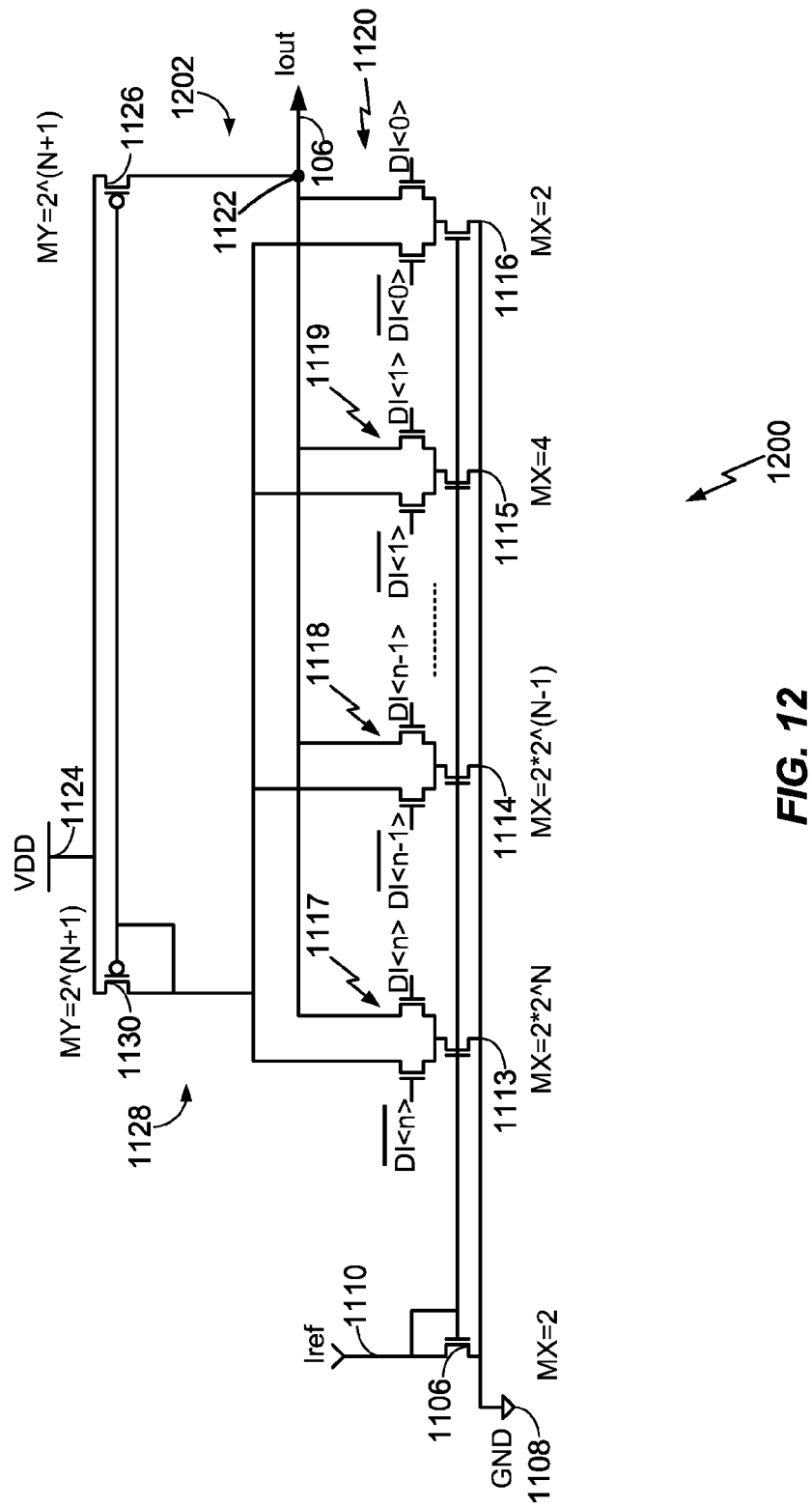
FIG. 12 is a schematic representation of a current steering DAC with a current source output stage in accordance with another configuration.

FIG. 12 is a schematic representation of a current steering DAC 1200 with a current source output stage 1202 in accordance with another configuration. For this example, one drain output of each differential pair 1117-1120 is connected directly to the DAC output 1122 and the other is connected to the reference device 1128 of the PMOS current mirror 1228. The sources of the devices of the PMOS current minor are connected to the positive power supply 1124. The gate and drain of the reference device 1130 are both connected to the drains of the NMOS differential pair transistors which are not connected directly to the DAC output 1122. The voltage generated on the gate of the PMOS current mirror reference device 1130 is applied to the PMOS current source transistor 1126 that has a drain connected to the DAC output 1122. As a result, the DAC output 1122 can source either negative or positive currents depending on the value of the DAC digital input word.

Figure 13A:
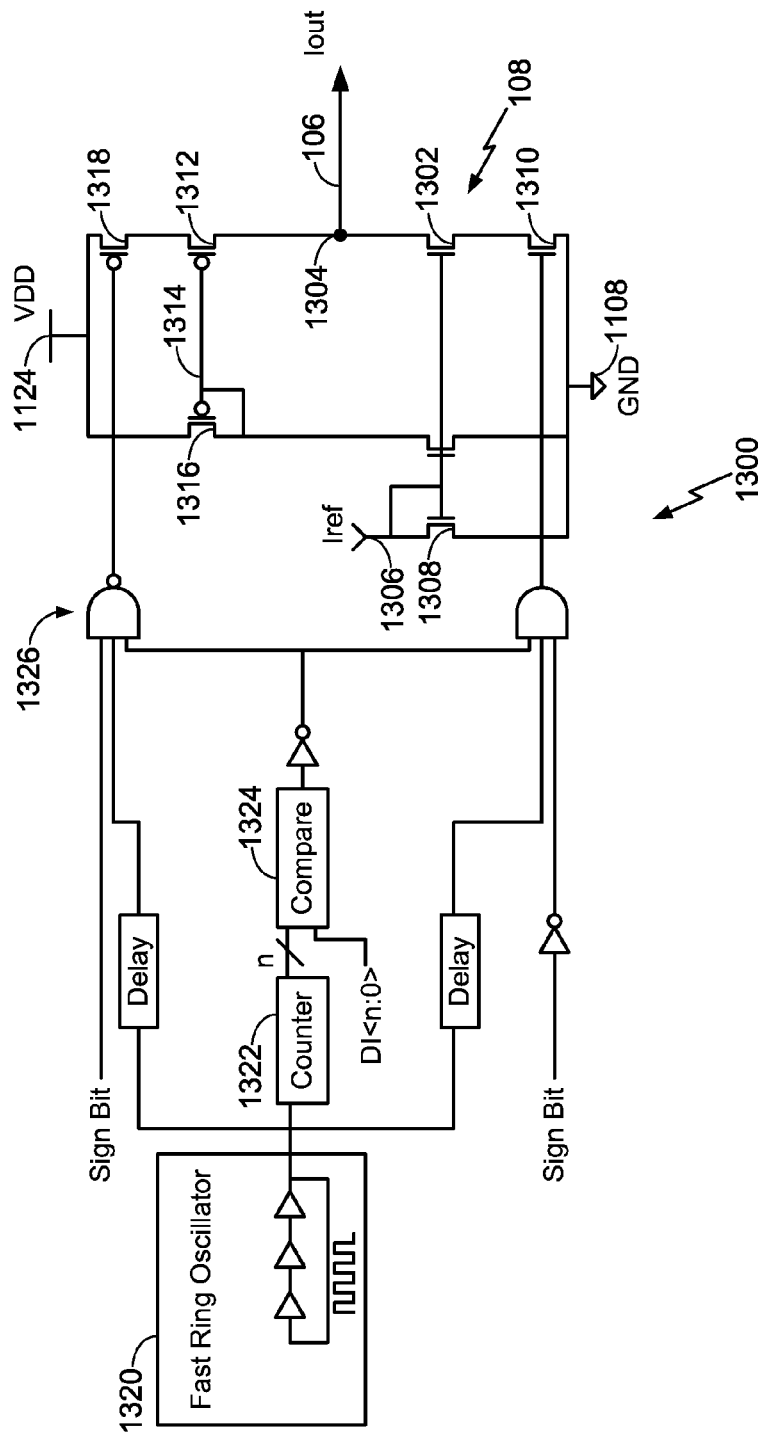
FIG. 13A is a schematic representation of an exemplary current pulse DAC with a current source output stage.

FIG. 13A is a schematic representation of an exemplary current pulse DAC 1300 with a current source output stage 1302 (108). For the example, the digital input word is DI<n:0> and a sign bit to indicate if the filtered phase error is positive or negative. All transistors have the same width/length ratio.

The current source output stage 1302 (108) is implemented as a single NMOS transistor 1302 with drain connected to the DAC output 1304, the gate connected to a reference voltage created by applying a reference current 1306 to the drain and gate of a NMOS transistor 1308 with source connected to ground 1108, and the source connected to a switch 1310 which connects to ground 1108. The DAC output value 106 is programmed by pulsing the switch 1310 on and off a number of times equal to the DAC input word DI<n:0>. A complementary current source output stage 1312 is implemented as a single PMOS transistor 1312 with drain connected to the DAC output 1304, the gate connected to a reference voltage 1314 created by applying a copy of the NMOS reference current to the drain and gate of a PMOS transistor 1316 with source connected to the positive power supply 1124, and the source connected to a switch 1318 which connects to the positive power supply 1124. Either the NMOS 1302 or the PMOS current source 1304 is selected to be active by the sign bit of the DAC input word. If the input word is unsigned, the most significant bit of the DAC input can be used as the sign bit. A ring oscillator 1320 drives a pulse counter 1322, the output of the counter 1322 drives a digital comparator 1324 which compares the count with the DAC digital input word, or digital input word minus the most significant bit for unsigned DAC digital input words. When the count is less than the DAC digital input word, logic circuitry 1326 couples the ring oscillator signal to the gate control of the switch 1302, 1310 in the source of the NMOS current source transistor 1302 or PMOS current source transistor 1312 and creates one equal pulse of current for each ring oscillator period. When the count exceeds the DAC digital input word, the ring oscillator signal is blocked from the gate control of the NMOS or PMOS current source switch transistor. The counter is reset to zero once at the start of each reference period, allowing the next DAC input word to be converted to an analog current output sample. In some circumstances, a connection from the comparator output to the ring oscillator provides an enable signal to the ring oscillator so that the ring oscillator is disabled after the required number of pulses is counted. The DAC output for this example is a series of current pulses where the total number of pulses per sample is equal to the DAC input word.

Figure 13B:
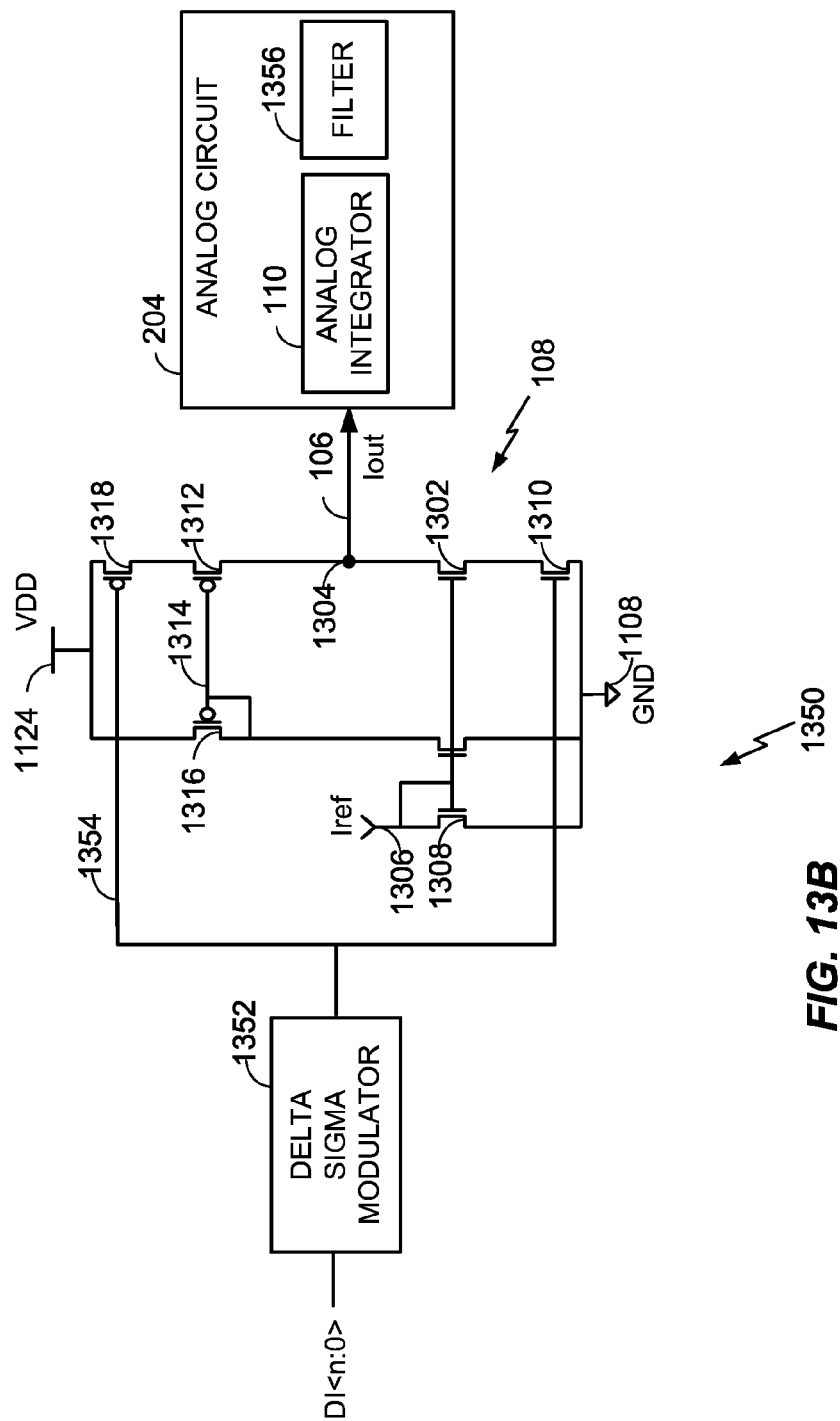
FIG. 13B is a schematic representation of an exemplary current DAC with a delta sigma modulator and a current source output stage.

FIG. 13B is a schematic representation of an exemplary delta sigma current DAC 1350 with a delta sigma modulator 1352 and a current source output stage 1302 (108) connected to an analog circuit 204. The delta sigma current DAC 1350 converts the multiple bit digital word to single bit sign signal 1354. The sign signal 1354 drives the switches 1310, 1318 to generate the current output signal. Accordingly, the current source output stage 1302 of the delta sigma current DAC provides a delta sigma modulated continuous current output signal. The delta sigma modulated continuous current output signal has a number of levels dependent on the number of bits. Although the example shown in FIG. 13B includes a single bit DAC, multi-bit DACs of 2, 3, 4 or more bits can also be used with the delta sigma modulator with 2, 3, 4 or more bit signal output to make a delta sigma current DAC in some circumstances. For the example of FIG. 13B, therefore, the output current signal is a single bit signal that varies between two levels. As is known, the quantization noise generated by a sigma delta modulator is often a function of frequency. In some circumstances, therefore, additional filtering is provided within the PLL. In exemplary embodiments where the delta sigma current DAC 1350 is implemented within the PLL device, the analog circuit 204 includes analog elements forming two poles in a filtering response. Accordingly, the analog circuit includes a filter 1356 for filtering quantization noise in the exemplary embodiment.

Figure 14:
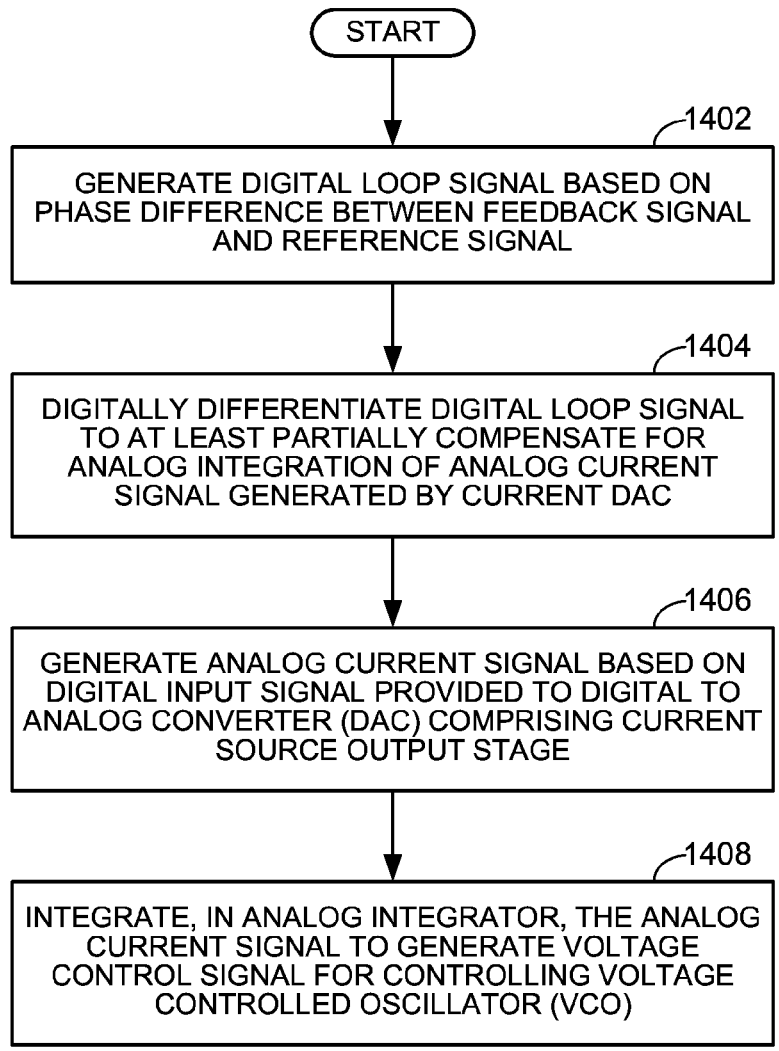
FIG. 14 is a flow chart of a method of managing a phase locked loop with digital differentiation to compensate for analog integration.

FIG. 14 is a flow chart of a method of managing a phase locked loop with digital differentiation to compensate for analog integration. The method may be performed with any combination of hardware, software and/or firmware.

At step 1402 a digital loop signal is generated based on a phase difference between a feedback signal and a reference signal. A digital phase detector can be used to compare the feedback signal and the reference signal in implementations where the feedback signal and reference signal are provided as digital signals. In implementations where the signals are analog signals, the phase comparison may be performed by a phase to digital converter or an analog phase detector followed by a time to digital converter. The digital loop signal is at least partially based on the correction signal resulting from the phase comparison. As discussed below, for example, the digital correction signal generated by the phase detector may be further processed with filtering and modulation to generate the digital loop signal.

At step 1404, the digital loop signal is digitally differentiated to at least partially compensate for analog integration of an analog current signal generated by a current source output stage of a current DAC. The analog current signal is integrated to generate the voltage control signal to control the VCO. Depending on the particular implementation, the digital differentiation may be performed by a standalone circuit or the differentiation function may be part of a digital processing circuit performing other processing within the loop. The differentiation of the digital loop signal generates a digital input signal.

At step 1406, the analog current signal is generated based on the digital input signal. The digital input signal is received at the input of a current DAC that includes a current source output stage. The current DAC converts the digital input signal into the analog current signal. The current DAC may provide a pulsed current signal or time-varying continuous signal, depending on the type of current DAC that is used.

At step 1408, the analog current signal is integrated to generate the control voltage signal for controlling the VCO. An analog device or circuit such as capacitor integrates the analog current signal. The analog integration may be performed by a standalone analog device or circuit or the analog integration function may be part of analog processing of the analog current signal performed by an analog circuit including the analog integrator. Accordingly, the digital differentiation at least partially compensates for the analog integration where the two functions may be part of other processing.

Figure 15:
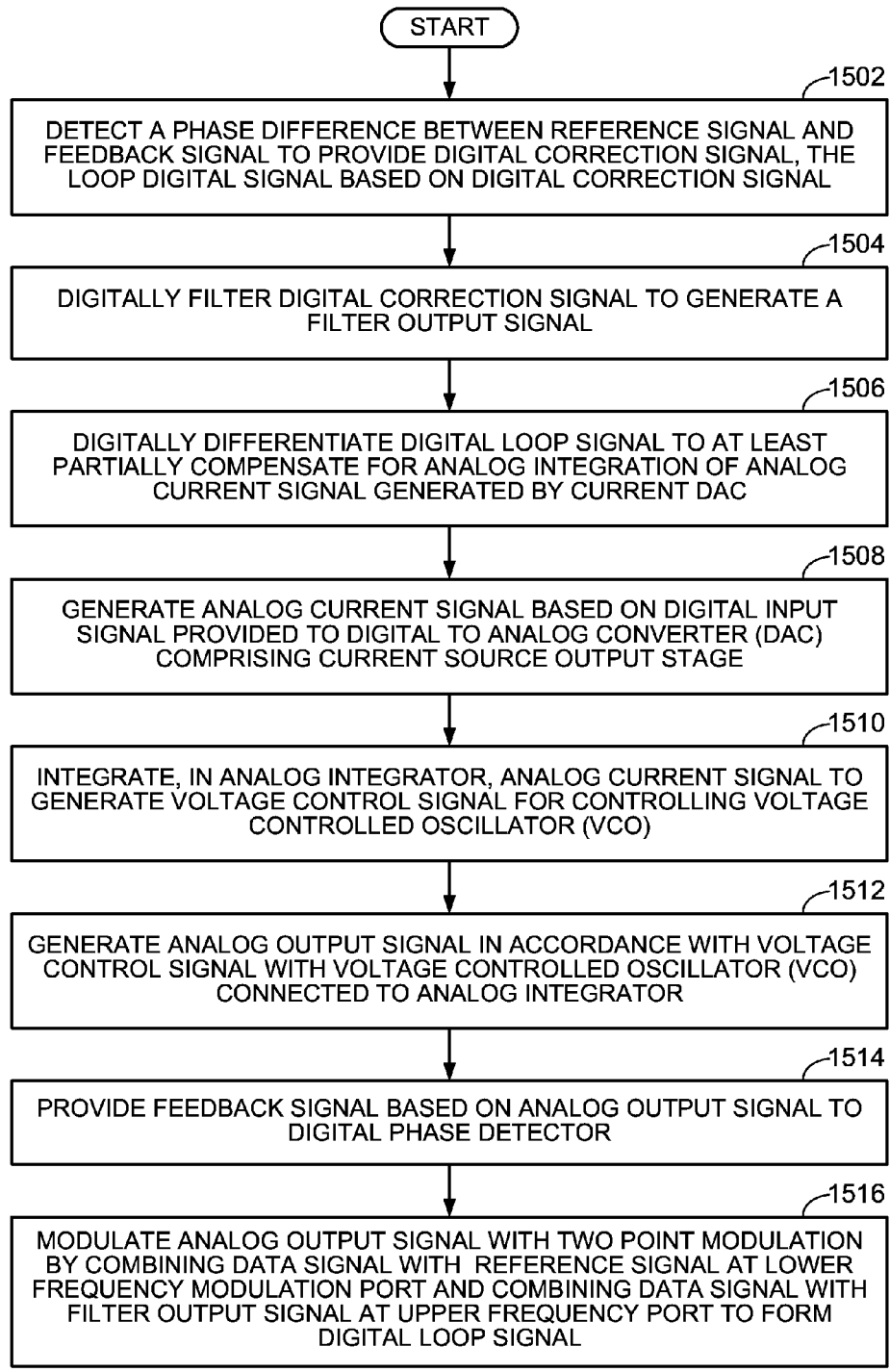
FIG. 15 is a flow chart of a method of managing a PLL that includes two point modulation in the reference path and loop control path.

FIG. 15 is a flow chart of a method of managing a PLL that includes two point modulation in the reference path and loop control path. The method discussed with reference to FIG. 15 is an example of an implementation of the method discussed with reference to FIG. 14.

At step 1502, the phase difference between the reference signal and the feedback signal is detected to provide a digital correction signal. A digital phase detector compares a digital feedback signal to a digital reference signal to generate the digital correction signal.

At step 1504, the digital correction signal is digitally filtered to generate the filter output signal. The digital filtering at least partially establishes a loop bandwidth of the loop The digital loop signal is at least partially based on the filter output signal. Where no additional processing is performed between the digital filter and the digital differentiator, the filter output signal is the digital loop signal. As discussed below, however, the digital loop signal includes the filter output signal as well as data where modulation is introduced into the loop after the digital filter.

At step 1506, the digital loop signal is digitally differentiated to at least partially compensate for the analog integration of the analog current signal. The analog current signal is integrated to generate the voltage control signal to control the VCO. The differentiation of the digital loop signal generates a digital input signal.

At step 1508, the analog current signal is generated based on the digital input signal. The digital input signal is received at the input of a current DAC that includes a current source output stage. The current DAC converts the digital input signal into the analog current signal.

At step 1510, the analog current signal is integrated to generate the control voltage signal for controlling the VCO. An analog integrator such as capacitor integrates the analog current signal to form a voltage control signal. Where the current DAC 1350 includes a delta sigma modulator 1352, additional filtering is performed on the integrated signal current signal. The filtering may use any number of poles and may be performed within the same analog circuit performing the integration as long as the additional poles are higher in frequency than the poles in the digital filter such that the frequency response of the additional filtering is flat at low frequencies where the digital filter operates and provides attenuation at frequencies much higher than the digital filter.

Accordingly, step 1506, 1508 and 1510 perform the functions of steps 1404, 1406 and 1408 of FIG. 14.

At step 1512, an analog output signal is generated. The VCO generates the analog output signal in accordance with the voltage control signal. The output signal of the VCO has a frequency that depends on the voltage control signal.

At step 1514, a feedback signal based on the analog output signal is provided to the digital phase detector. The feedback signal is a digital number that represents the phase of the analog output signal. As described above, an example of suitable technique for providing the digital feedback signal including using a phase accumulator and a TDC.

At step 1516, the analog output signal is modulated with two point modulation by combining a data signal with the reference signal at lower frequency port and combining the data signal with the filter output signal at the upper frequency port. The digital loop signal, therefore, includes a combination of the data signal and the filter output signal.

Figure 16:
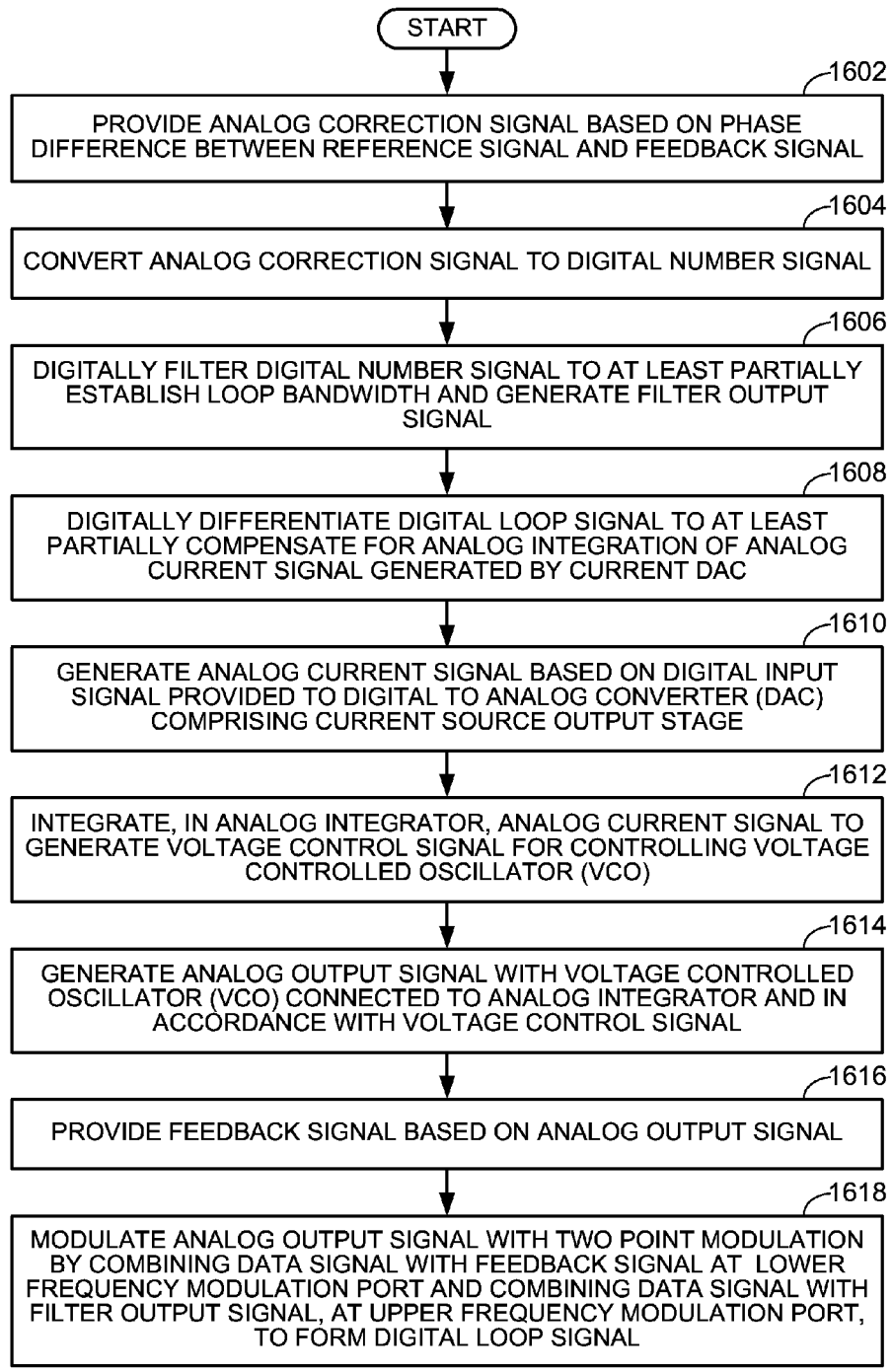
FIG. 16 is a flow chart of a method of managing a PLL that includes two point modulation in the feedback path and loop control path.

FIG. 16 is a flow chart of a method of managing a PLL that includes two point modulation in the feedback path and loop control path. The method discussed with reference to FIG. 16 is an example of an implementation of the method discussed with reference to FIG. 14.

At step 1602, the phase difference between the reference signal and the feedback signal is detected to provide an analog correction signal. An analog phase-frequency detector compares an analog feedback signal to an analog reference signal to generate the analog correction signal.

At step 1604, the analog correction signal is converted to a digital number signal. As discussed above, an example of suitable technique for converting the signal to the digital number signal includes using a time to digital converter (TDC).

At step 1606, the digital number signal is digitally filtered to generate the filter output signal. The digital filtering at least partially establishes a loop bandwidth of the loop. The digital loop signal is at least partially based on the filter output signal. Where no additional processing is performed between the digital filter and the digital differentiator, the filter output signal is the digital loop signal. As discussed below, however, the digital loop signal includes the filter output signal as well as data where modulation is introduced into the loop after the digital filter.

At step 1608, the digital loop signal is digitally differentiated to at least partially compensate for the analog integration of the analog current signal. The analog current signal is integrated to generate the voltage control signal to control the VCO. The differentiation of the digital loop signal generates a digital input signal.

At step 1610, the analog current signal is generated based on the digital input signal. The digital input signal is received at the input of a current DAC that includes a current source output stage. The current DAC converts the digital input signal into the analog current signal.

At step 1612, the analog current signal is integrated to generate the control voltage signal for controlling the VCO. An analog integrator such as capacitor integrates the analog current signal to form a voltage control signal.

Accordingly, step 1608, 1610, and 1612 perform the functions of steps 1404, 1406 and 1408 of FIG. 14. Steps 1602, 1604 and 1606 are exemplary implementations of step 1402.

At step 1614, an analog output signal is generated. The VCO generates the analog output signal in accordance with the voltage control signal. The output signal of the VCO has a frequency that depends on the voltage control signal.

At step 1616, a feedback signal based on the analog output signal is provided to the phase-frequency detector. The feedback signal is an analog signal that is based on the analog output signal of the VCO. As described above, an example of suitable technique for providing the digital feedback signal including using a prescaler a fractional N divider in the feedback 306.

At step 1618, the analog output signal is modulated with two point modulation by combining a data signal with the feedback signal at a lower frequency port and combining the data signal with the filter output signal at the upper frequency port. The digital loop signal, therefore, includes a combination of the data signal and the filter output signal.

Figure 17:
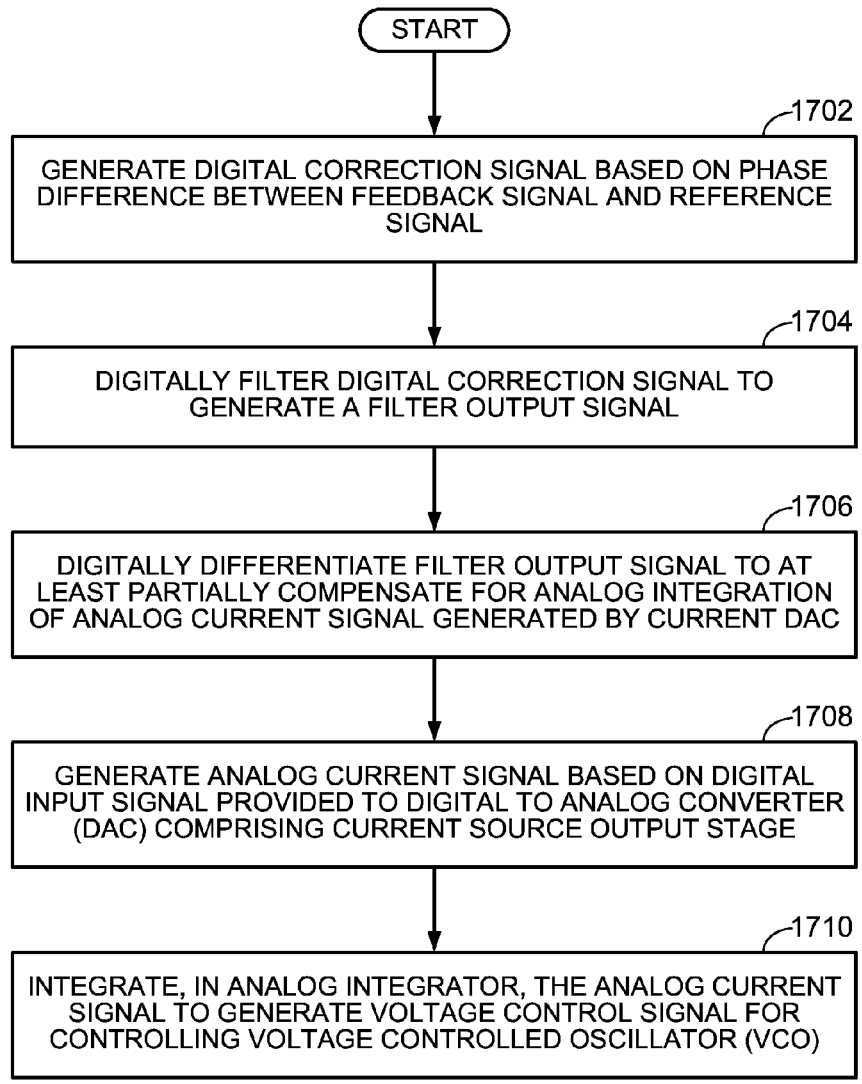
FIG. 17 is a flow chart of a method of managing a phase locked loop with digital differentiation to compensate for analog integration in a PLL device including a digital filter.

FIG. 17 is a flow chart of a method of managing a phase locked loop with digital differentiation to compensate for analog integration in a PLL device including a digital filter. The method may be performed with any combination of hardware, software and/or firmware and is an example of the method described with reference to FIG. 14 where digitally filtering is performed.

At step 1702 a digital correction signal is generated based on a phase difference between a feedback signal and a reference signal. A digital phase detector can be used to compare the feedback signal and the reference signal in implementations where the feedback signal and reference signal are provided as digital signals. In implementations where the signals are analog signals, the phase comparison may be performed by a phase to digital converter or an analog phase detector followed by a time to digital converter.

At step 1704, the digital correction signal is digitally filtered to generate a filter output signal.

At step 1706, the filter output signal is digitally differentiated to at least partially compensate for analog integration of an analog current signal generated by a current source output stage of a current DAC. The analog current signal is integrated to generate the voltage control signal to control the VCO. The differentiation of the filter output signal generates a digital input signal.

At step 1708, the analog current signal is generated based on the digital input signal. The digital input signal is received at the input of a current DAC that includes a current source output stage. The current DAC converts the digital input signal into the analog current signal. The current DAC may provide a pulsed current signal or time-varying continuous signal, depending on the type of current DAC that is used.

At step 1710, the analog current signal is integrated to generate the control voltage signal for controlling the VCO. An analog device or circuit such as capacitor integrates the analog current signal. The analog integration may be performed by a standalone analog device or circuit or the analog integration function may be part of analog processing of the analog current signal performed by an analog circuit including the analog integrator.

Figure 18:
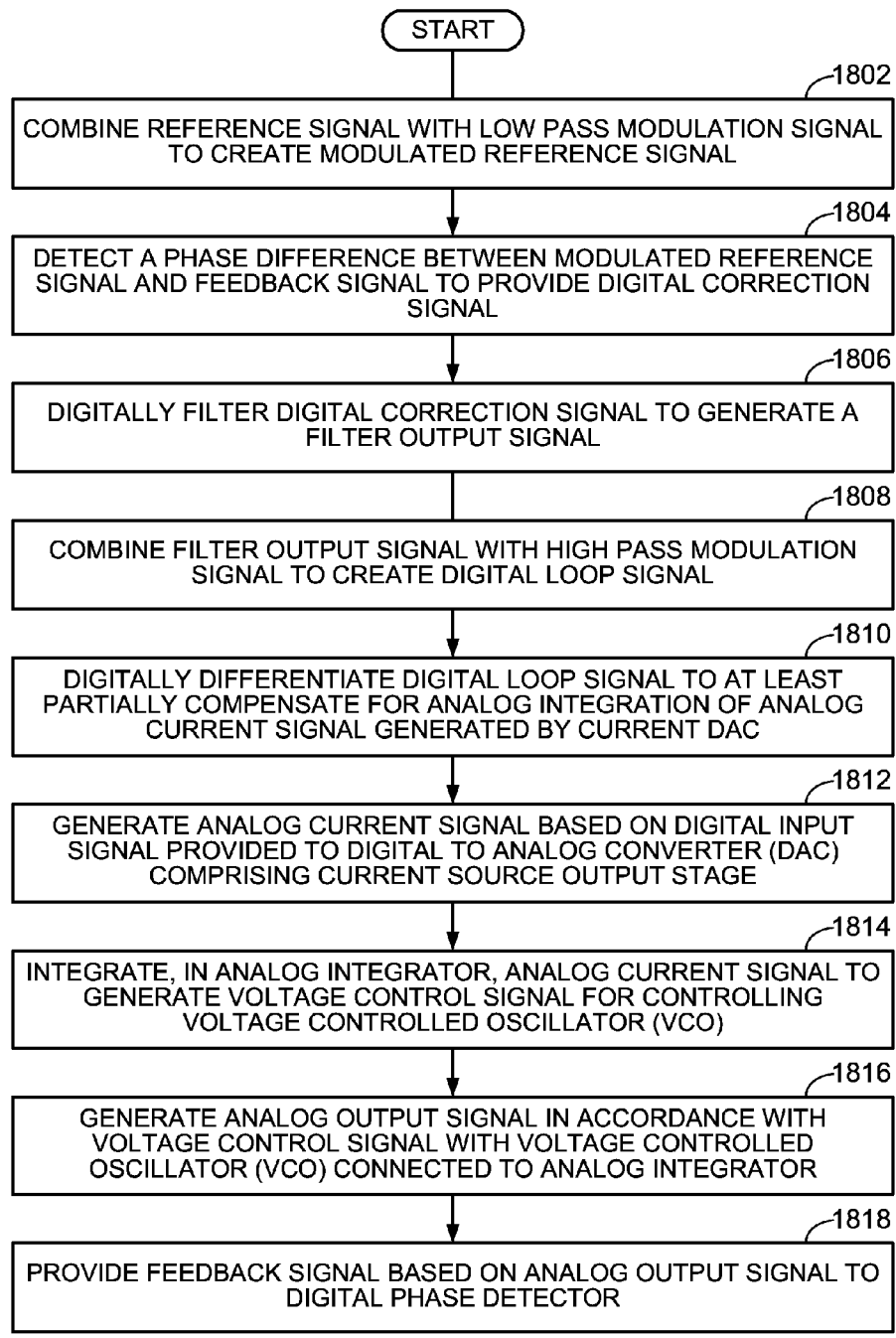
FIG. 18 is a flow chart of a method of applying two point modulation in the reference path and DCO control path to a PLL that includes digital differentiation for compensating for analog integration.

FIG. 18 is a flow chart of a method of applying two point modulation in the reference path and DCO control path to a PLL that includes digital differentiation for compensating for analog integration. Accordingly, the method discussed with reference to FIG. 18 is an example of the methods discussed with reference to FIG. 15 and FIG. 14. More specifically, the method of FIG. 18 discusses the steps performed within the PLL for implementing step 1516 of FIG. 15.

At step 1802, the reference signal and the data from the lower frequency port are combined to create a modulated reference signal. In the exemplary embodiment, the phase combiner 602 combines the phase data 506 and the reference signal 310.

At step 1804, the phase difference between the modulated reference signal and the feedback signal is detected to provide a digital correction signal. A digital phase detector compares a digital feedback signal to a digital reference signal that modulated with the data to generate the digital correction signal.

At step 1806, the digital correction signal is digitally filtered to generate the filter output signal.

At step 1808, the filter output signal is combined with the data from the higher frequency modulation port to create the digital loop signal. In the exemplary embodiment, the gain adapted and normalized data signal is combined in the combiner 624.

At step 1810, the digital loop signal is digitally differentiated to at least partially compensate for the analog integration of the analog current signal. The analog current signal is integrated to generate the voltage control signal to control the VCO. The differentiation of the digital loop signal generates a digital input signal.

At step 1812, the analog current signal is generated based on the digital input signal. The digital input signal is received at the input of a current DAC that includes a current source output stage. The current DAC converts the digital input signal into the analog current signal.

At step 1814, the analog current signal is integrated to generate the control voltage signal for controlling the VCO. An analog integrator such as capacitor integrates the analog current signal to form a voltage control signal.

At step 1816, an analog output signal is generated. The VCO generates the analog output signal in accordance with the voltage control signal. The output signal of the VCO has a frequency that depends on the voltage control signal.

At step 1818, a feedback signal based on the analog output signal is provided to the digital phase detector. The feedback signal is a digital number that represents the phase of the analog output signal. As described above, an example of suitable technique for providing the digital feedback signal including using a phase accumulator and a TDC.

Figure 19:
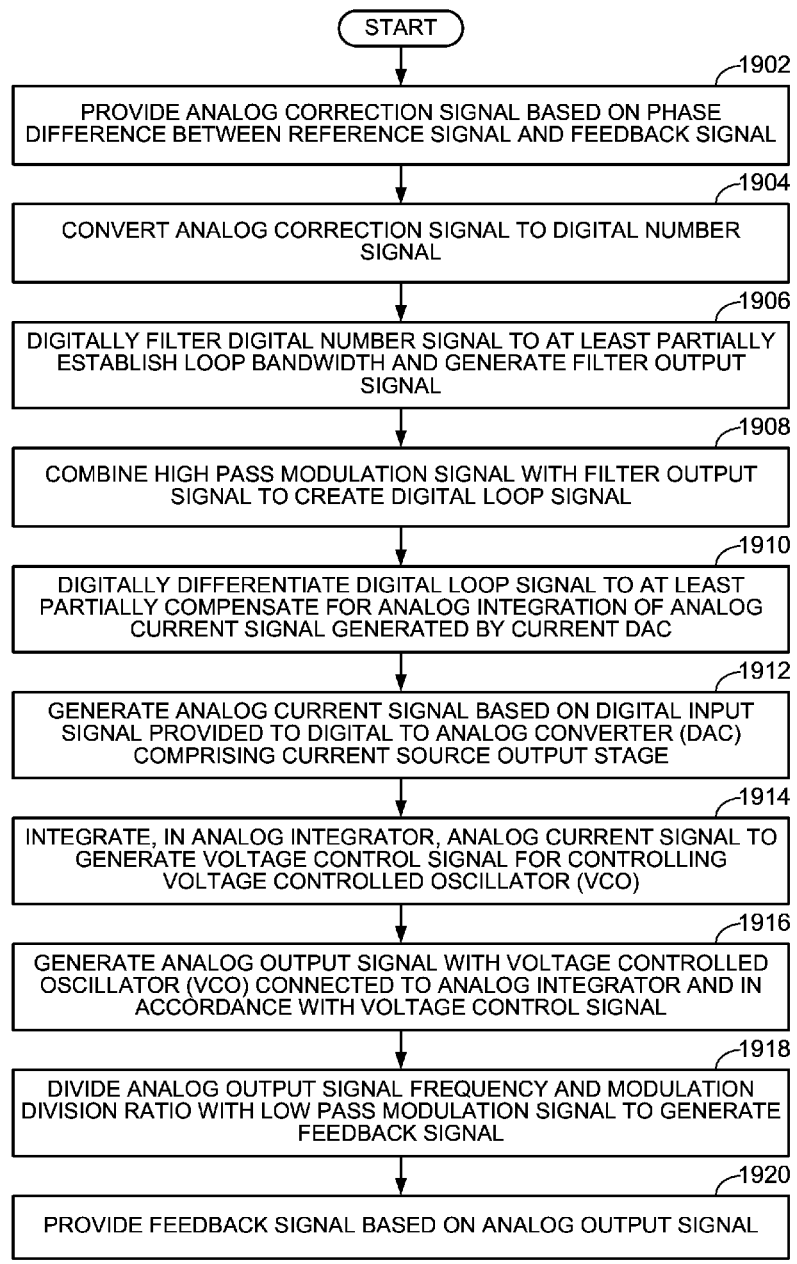
FIG. 19 is a flow chart of a method of applying two point modulation in the feedback path and DCO control path of a PLL that includes digital differentiation compensating for analog integration.

FIG. 19 is a flow chart of a method of applying two point modulation in the feedback path and DCO control path of a PLL that includes digital differentiation compensating for analog integration. Accordingly, the method discussed with reference to FIG. 19 is an example of the methods discussed with reference to FIG. 16 and FIG. 14. More specifically, the method of FIG. 19 discusses the steps performed within the PLL for implementing step 1518 of FIG. 16.

At step 1902, the phase difference between the reference signal and the feedback signal is detected to provide an analog correction signal. An analog phase-frequency detector compares an analog feedback signal to an analog reference signal to generate the analog correction signal.

At step 1904, the analog correction signal is converted to a digital number signal. As discussed above, an example of suitable technique for converting the signal to the digital number signal includes using a time to digital converter (TDC).

At step 1906, the digital number signal is digitally filtered to generate the filter output signal. The digital filtering at least partially establishes a loop bandwidth of the loop.

At step 1908, data received through the higher frequency modulation port is combined with the filter output signal to generate the digital loop signal. The gain adapted and normalized data signal is combined with the filter output signal in the combiner.

At step 1910, the digital loop signal is digitally differentiated to at least partially compensate for the analog integration of the analog current signal. The analog current signal is integrated to generate the voltage control signal to control the VCO. The differentiation of the digital loop signal generates a digital input signal.

At step 1912, the analog current signal is generated based on the digital input signal. The digital input signal is received at the input of a current DAC that includes a current source output stage. The current DAC converts the digital input signal into the analog current signal.

At step 1914, the analog current signal is integrated to generate the control voltage signal for controlling the VCO. An analog integrator such as capacitor integrates the analog current signal to form a voltage control signal.

At step 1916 an analog output signal is generated. The VCO generates the analog output signal in accordance with the voltage control signal. The output signal of the VCO has a frequency that depends on the voltage control signal.

At step 1918, the analog output signal frequency is divided in accordance with the modulation division ratio and the data received through the lower frequency modulation port connected to the feedback. The division ratio of the fractional N divider is varied in accordance with the data At step 1920, a feedback signal based on the sigma delta modulated analog output signal is provided to the phase-frequency detector. The feedback signal is an analog signal that is based on the analog output signal of the VCO that has been modulated by the fractional N divider.

The steps discussed with reference to FIG. 14, FIG. 15, FIG. 16, FIG. 17, FIG. 18 and FIG. 19 may be performed by any combination devices circuitry and/or code. Further, the order of the steps may be changed in some circumstances and two or more steps can be performed simultaneously. In addition, one or more steps may be omitted in some circumstances.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

The invention claimed is:

1. An apparatus comprising:
an upper frequency port configured to generate a digital loop signal based at least in part on a data signal;
a digital differentiator configured to differentiate the digital loop signal to generate a digital input signal;
a digital-to-analog converter (DAC) configured to generate an analog current signal based on the digital input signal;
circuitry configured to generate a first feedback signal based on the analog current signal; and
a lower frequency port configured to generate a second feedback signal based on the first feedback signal and further based on the data signal.

2. The apparatus of claim 1, wherein the circuitry includes an analog integrator configured to generate a voltage control signal based on the analog current signal.

3. The apparatus of claim 2, wherein the circuitry further includes a voltage controlled oscillator (VCO) configured to generate an analog output signal based on the voltage control signal.

4. The apparatus of claim 3, wherein the circuitry further includes a feedback device configured to generate the first feedback signal based on the analog output signal.

5. The apparatus of claim 4, wherein the feedback device includes a fractional divider.

6. The apparatus of claim 1, further comprising a phase-to-digital converter (PDC) configured to generate a digital signal based on the second feedback signal.

7. The apparatus of claim 6, wherein the PDC includes:
a phase-frequency detector configured to generate an analog correction signal based on the second feedback signal and further based on a reference signal; and
a time-to-digital converter (TDC) configured to generate the digital signal based on the analog correction signal.

8. The apparatus of claim 6, further comprising a digital filter configured to generate a filter output signal based on the digital signal.

9. The apparatus of claim 8, wherein the upper frequency port is further configured to generate the digital loop signal further based on the filter output signal.

10. The apparatus of claim 1, wherein the DAC includes a current source output stage configured to generate the analog current signal.

11. The apparatus of claim 1, further comprising a phase-locked loop (PLL), wherein the upper frequency port, the digital differentiator, the DAC, the circuitry, and the lower frequency port are integrated within the PLL.

12. A method of performing modulation of a data signal at a phase-locked loop (PLL), the method comprising:
generating, at an upper frequency port of the PLL, a digital loop signal based at least in part on the data signal;
differentiating the digital loop signal to generate a digital input signal;
converting the digital input signal to an analog current signal;
generating a first feedback signal based on the analog current signal; and
generating, at a lower frequency port of the PLL, a second feedback signal based on the first feedback signal and further based on the data signal.

13. The method of claim 12, further comprising:
integrating the analog current signal to generate a voltage control signal;
generating an analog output signal based on the voltage control signal; and
generating the first feedback signal based on the analog output signal.

14. The method of claim 12, further comprising:
generating an analog correction signal based on the second feedback signal and further based on a reference signal; and
converting the analog correction signal to generate a digital signal.

15. The method of claim 14, further comprising generating a filter output signal based on the digital signal, wherein the digital loop signal is generated further based on the filter output signal.

16. The method of claim 12, wherein the modulation comprises performing two-point modulation at the PLL using the upper frequency port and the lower frequency port.

17. An apparatus comprising:
means for generating a digital loop signal based at least in part on a data signal;
means for differentiating the digital loop signal to generate a digital input signal;
means for converting the digital input signal to an analog current signal;
means for generating a first feedback signal based on the analog current signal; and
means for generating a second feedback signal based on the first feedback signal and further based on the data signal.

18. The apparatus of claim 17, wherein the means for generating the digital loop signal includes an upper frequency port.

19. The apparatus of claim 17, wherein the means for differentiating the digital loop signal includes a digital differentiator.

20. The apparatus of claim 17, wherein the means for converting the digital input signal includes a digital-to-analog converter (DAC).

21. The apparatus of claim 17, wherein the means for generating the first feedback signal includes an analog integrator and a voltage controlled oscillator (VCO).

22. The apparatus of claim 17, wherein the means for generating the second feedback signal includes a lower frequency port.

23. The apparatus of claim 17, further comprising a phase-locked loop (PLL), wherein the means for generating the digital loop signal, the means for differentiating the digital loop signal, the means for converting the digital input signal, the means for generating the first feedback signal, and the means for generating the second feedback signal are integrated within the PLL.

24. A non-transitory computer-readable medium storing instructions that are executable by a processor to initiate operations of a phase-locked loop (PLL), wherein the operations include:
generating, at an upper frequency port of the PLL, a digital loop signal based at least in part on a data signal;
differentiating the digital loop signal to generate a digital input signal;
converting the digital input signal to an analog current signal;
generating a first feedback signal based on the analog current signal; and
generating, at a lower frequency port of the PLL, a second feedback signal based on the first feedback signal and further based on the data signal.

25. The non-transitory computer-readable medium of claim 24, wherein the operations further include:
generating, at a phase-to-digital converter (PDC), a digital signal based on the second feedback signal and further based on a reference signal; and filtering the digital signal to generate a filter output signal, wherein the digital loop signal is generated further based on the filter output signal.

* * * * *